(12) United States Patent
Muramatsu et al.

(10) Patent No.: US 8,835,773 B2
(45) Date of Patent: Sep. 16, 2014

(54) WIRING BOARD AND METHOD OF MANUFACTURING THE SAME

(75) Inventors: Shigetsugu Muramatsu, Nagano (JP); Yasuhiko Kusama, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 254 days.

(21) Appl. No.: 12/752,692

(22) Filed: Apr. 1, 2010

(65) Prior Publication Data

US 2010/0252304 A1  Oct. 7, 2010

(30) Foreign Application Priority Data

Apr. 6, 2009  (JP) .................................. 2009-092252

(51) Int. Cl.
| | | |
|---|---|---|
| *H05K 1/16* | (2006.01) | |
| *H05K 7/00* | (2006.01) | |
| *H05K 3/34* | (2006.01) | |
| *H01L 23/498* | (2006.01) | |
| *H01L 21/56* | (2006.01) | |
| *H05K 3/00* | (2006.01) | |
| *H01L 23/31* | (2006.01) | |
| *H05K 3/30* | (2006.01) | |
| *H05K 1/11* | (2006.01) | |
| *H05K 3/24* | (2006.01) | |

(52) U.S. Cl.
CPC ........ *H05K 3/3452* (2013.01); *H05K 2203/025* (2013.01); *H01L 23/49827* (2013.01); *H01L 2924/01078* (2013.01); *H01L 21/563* (2013.01); *H05K 3/305* (2013.01); *H05K 2201/0191* (2013.01); *H01L 2924/01019* (2013.01); *H01L 2224/73203* (2013.01); *H05K 3/0044* (2013.01); *H05K 2201/09045* (2013.01); *H01L 2224/32225* (2013.01); *H05K 2201/10977* (2013.01); *H01L 2224/16225* (2013.01); *H05K 2201/09881* (2013.01); *H01L 23/3121* (2013.01); *H05K 2201/09736* (2013.01); *H05K 1/111* (2013.01); *H05K 2201/10674* (2013.01); *H05K 3/243* (2013.01); *H05K 2201/09036* (2013.01); *H01L 2924/01079* (2013.01); *H01L 2224/73204* (2013.01)
USPC ........... 174/260; 174/251; 174/255; 361/753; 361/760; 361/761; 361/807; 361/809

(58) Field of Classification Search
None
See application file for complete search history.

(56) References Cited

U.S. PATENT DOCUMENTS

| | | | |
|---|---|---|---|
| 5,218,234 A | 6/1993 | Thompson et al. | ........... 257/787 |
| 6,988,312 B2 * | 1/2006 | Nakamura et al. | .............. 29/830 |

(Continued)

FOREIGN PATENT DOCUMENTS

| | | |
|---|---|---|
| JP | 5-283478 | 10/1993 |
| JP | 2004-186213 | 7/2004 |

(Continued)

*Primary Examiner* — Jayprakash N Gandhi
*Assistant Examiner* — Dion R Ferguson
(74) *Attorney, Agent, or Firm* — Kratz, Quintos & Hanson, LLP

(57) ABSTRACT

A method of manufacturing a wiring board for use in mounting of an electronic component includes: forming an outermost wiring layer on a surface side where the electronic component is mounted; forming an insulating layer so as to cover the wiring layer; and forming a concave portion in the insulating layer. The concave portion is formed by removing, using a mask formed in a required shape by patterning, an exposed portion of the insulating layer in a step-like shape until a surface of a pad defined at a portion of the wiring layer is exposed. The concave portion is preferably formed by removing the portion of the insulating layer by sand blast.

4 Claims, 18 Drawing Sheets

(56) References Cited

U.S. PATENT DOCUMENTS

| | | | | |
|---|---|---|---|---|
| 2007/0201215 A1* | 8/2007 | Ito et al. | .......... | 361/760 |
| 2008/0251279 A1* | 10/2008 | Muramatsu et al. | .......... | 174/250 |
| 2009/0211795 A1* | 8/2009 | Shirasawa | .......... | 174/260 |
| 2010/0147573 A1* | 6/2010 | Fukuda | .......... | 174/260 |

FOREIGN PATENT DOCUMENTS

| | | | | |
|---|---|---|---|---|
| JP | 2006-344664 | 12/2006 | | |
| JP | 2010-087018 | 4/2010 | | |
| WO | WO2009/031588 | * | 3/2009 | ............ H05K 1/18 |

* cited by examiner

WIRING BOARD AND METHOD OF MANUFACTURING THE SAME

CROSS-REFERENCE TO RELATED APPLICATIONS

This application is based on and claims priority of Japanese Patent Application No. 2009-092252 filed on Apr. 6, 2009, the entire contents of which are incorporated herein by reference.

BACKGROUND OF THE INVENTION (a) Field of the Invention

The present invention relates to a wiring board for use in flip-chip mounting of an electronic component (chip) such as a semiconductor element, and a method of manufacturing the same.

Since serving as a package in which a semiconductor chip is mounted, the wiring board is also referred to as a "semiconductor package" for convenience in the following description.

(b) Description of the Related Art

In a structure in which a semiconductor chip is flip-chip bonded onto a wiring board, it is a general practice to reinforce the connection between the chip and the board by filling a gap therebetween with underfill resin in order to secure the reliability of the connection between the chip and the board. To bring about the reinforcement effect, filling is performed so that the underfill resin can slightly overflow from the gap between the chip and the board to the periphery thereof, and can form the skirt of a mountain extending downward from the chip located at the top of the mountain when viewed in cross section. Namely, the resin needs to be filled so that the resin overflowed from the gap between the chip and the board can further flow upward along a sidewall portion of the chip and then form a fillet portion.

Depending on the viscosity of the underfill resin used to fill the gap between the chip and the board, the underfill resin after the filling has low fluidity (when viscosity is high) or has high fluidity (when viscosity is low). This variation in fluidity influences the flowing way (behavior) of the resin within the area between the chip and the board, and the range in which the resin overflowing from the gap between the chip and the board spreads to the periphery thereof.

The underfill resin is infiltrated into a small gap (approximately 50 μm under current technology) between the chip and the board by capillary action. Here, the resin with low fluidity does not flow smoothly. For this reason, a void (air bubble) is likely to be formed in the resin filled inside an opening portion between the chip and the board during a process in which the resin flows to the inside of the opening portion from a portion (resin injection portion) along the outer periphery of the chip of the opening portion. When a void is formed, the reliability of the connection between the chip and the wiring board decreases because a sufficient bonding strength cannot be obtained. In addition, there is a concern that a crack is generated in the resin because the air in the void expands due to a heating (curing) process after the filling of the resin.

In order to avoid the generation of such a void, underfill resin having high fluidity may be used. However, the resin with high fluidity flows easily, so that an outflow range of the resin overflowing from the gap between the chip and the board may be extended more than necessary. In this case, other circuit elements, pads and the like disposed around the chip are negatively influenced. In particular, such a negative influence is more noticeable in wiring boards which are nowadays generally used for high-density packaging. With this regard, various techniques have been proposed for restricting the outflow range of the resin overflowing from the gap between the chip and the board (Namely, for preventing the resin from spreading more than necessary).

As a typical example of the aforementioned techniques, there is a method of producing a dam structure (a portion raised in a wall-like shape or a portion recessed in a groove-like shape) around the chip mounting area on the board. Examples of the method of producing such a dam structure include: a method in which a photosensitive insulating resin (solder resist) is patterned using a photolithography technique; a method in which an insulating resin is applied by a screen printing method; a method in which a plate-like member formed in a frame-like shape is attached; and the like. Techniques related to these methods are described in Japanese unexamined Patent Publication (JPP) (Kokai) 2004-186213, JPP (Kokai) 5-283478 and the like, for example.

Meanwhile, when there are irregularities in an area (board surface facing the chip) in which the resin injected from the opening portion around the chip flows to the inside of the opening portion and is filled, a void may possibly be generated in the vicinity of the irregular portion even if underfill resin with high fluidity is used. An example of this is a case where a level difference exists between the surface of the insulating layer (solder resist layer), which is the outermost layer, and the surface of a pad exposed from the insulating layer. Accordingly, in order to effectively suppress generation of voids, it is desirable to flatten the board surface on which the underfill resin flows.

A technique related to this is described in JPP (Kokai) 2006-344664. According to the technique described in this document (See FIG. 8), a belt-like wiring conductor 5a and a conductive protrusion 12 (equivalent to a pad) are first coated with resin 6a for a solder resist layer. Then, a solder resist layer 6 is formed by grinding the resin 6a until the upper surface of the conductive protrusion 12 is exposed. As a result, a wiring board 10 is obtained in which the upper surface of the conductive protrusion 12 is exposed to be substantially flush with the upper surface of the solder resist layer 6.

As described above, in the conventional wiring board for mounting a chip, the resin overflowing from the gap between the chip and board at the time of filling the gap with the underfill resin is prevented from spreading more than necessary by forming the dam structure around the chip mounting area on the board. In addition, when the dam structure is formed, an additional process is required. Specifically, the addition process is to form a dam portion on the outermost insulating layer (patterning of a photosensitive insulating resin by photolithography, coating with insulating resin by a printing method, attaching of a plate member formed in a frame-like shape, or the like) after the insulating layer positioned outermost (solder resist layer) is formed on the board.

Namely, there is a problem that the number of manufacturing steps and the costs associated therewith are increased because an additional process for forming the dam structure and a material used therefor are required.

The problem may occur as well in the aforementioned wiring board having a flat board surface on which underfill resin flows, such as described in JPP (Kokai) 2006-344664. Namely, in order to form the same dam structure as the aforementioned one on this wiring board, an additional process for forming the dam portion is required. Specifically, the additional process is to form the dam portion on the upper surface of the outermost insulating layer (solder resist layer) after performing the processing to align the upper surface of the outermost insulating layer with the upper surfaces of the pad (conductive protrusion) (to coat the conductive protrusion with the resin for the solder resist layer and then to grind this resin until the upper surface of the conductive protrusion is exposed).

SUMMARY OF THE INVENTION

An object of the present invention is to provide a method of manufacturing a wiring board capable of suppressing generation of voids while allowing filling to be easily performed by increasing fluidity of underfill resin when the filling is performed after mounting of an electronic component. The method achieves a dam structure capable of preventing the resin from overflowing onto an area where the resin is not necessary. In addition, the method is capable of forming the dam structure without the necessity of additional steps for forming the dam structure and the costs associated therewith.

According to one aspect of the invention, there is provided a method of manufacturing a wiring board for use in mounting of an electronic component, the method including: forming an outermost wiring layer on a surface side of the wiring board in a mounting area for electronic component; forming an insulating layer so as to cover the wiring layer; and forming a concave portion in a larger size than a size of the electronic component in a portion of the insulating layer by removing the portion of the insulating layer in a step-like shape until a surface of a pad defined at a portion of the wiring layer is exposed, the portion of the insulating layer corresponding to the mounting area for electronic component.

According to another aspect of the invention, there is provided a wiring board for use in mounting of an electronic component, the wiring board including: an outermost insulating layer which protects the wiring board and which includes a concave portion formed in a portion of the insulating layer in a larger size than a size of the electronic component by removing the portion of the insulating layer in a step-like shape, the portion of the insulating layer corresponding to a mounting area of the insulating layer for the electronic component; and a wiring layer covered by the insulating layer and including a pad defined at a portion of the wiring layer, wherein a surface of the pad is exposed to be flush with a surface of the insulating layer in the concave portion, and a side surface of the pad is covered by the insulating layer.

According to the manufacturing method of a wiring board according to the present invention, the surface of the pad is flush with the surface of the insulating layer in the concave portion (Namely, there is a flat surface with no irregularities in the area in which the underfill resin injected from the opening portion around the electronic component flows to the inside of the opening portion and is filled). For this reason, when the electronic component is mounted in the concave portion and the underfill resin is filled into the gap between the electronic component and the wiring board, the fluidity of the underfill resin is increased. Thereby, the filling of the resin can be easily performed while generation of voids can be effectively suppressed. As a result, a sufficient bonding strength between the electronic component and the wiring board is obtained to improve the connection reliability.

In addition, since the size of the area (concave portion) filled with the underfill resin is larger than the size of the electronic component, the underfill resin overflowing from the gap between the electronic component and the wiring board to the periphery thereof after the filling of the resin can be blocked by the step-like portion of the concave portion. Namely, the underfill resin overflowing from the gap between the electronic component and the wiring board to the periphery thereof is limited within a predetermined range. Thereby, other circuit elements, pads or the like arranged around the concave portion can be prevented from being negatively influenced.

In addition, the concave portion having a dam structure can be formed by removing the insulating layer portion corresponding to the mounting area of an electronic component into a step-like shape with respect to the insulating layer formed so as to cover the outermost wiring layer on the surface side for mounting an electronic component. At the same time, it is also possible to fabricate the structure in which the surface of the pad exposed in the concave portion and the surface of the insulating layer are flush with each other (flat surface without irregularities). Namely, the required dam structure can be easily formed without the necessity of the additional steps needed in the prior art process and the costs associated therewith.

DESCRIPTION OF THE PREFERRED EMBODIMENTS

Hereinafter, the description is given of preferred embodiments of the present invention with reference to the accompanying drawings.

First Embodiment

See FIGS. 1a to 5d

Figure 1A:
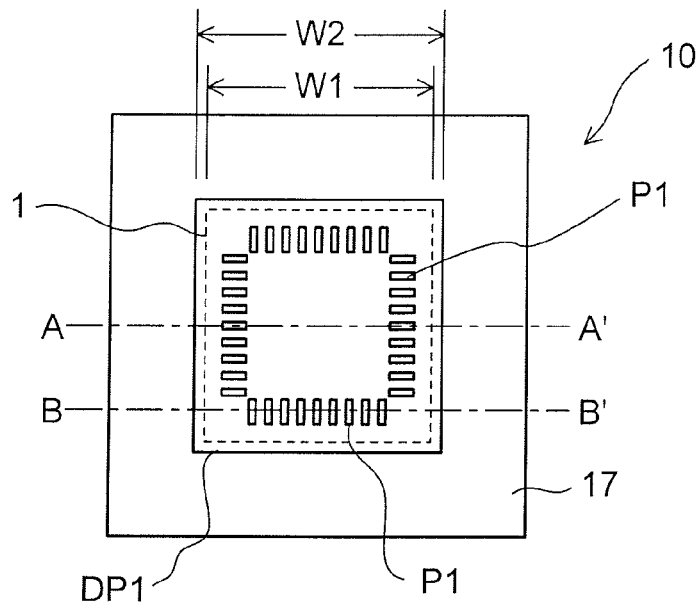
FIGS. 1A to 1C are diagrams for showing a configuration of a wiring board (semiconductor package) according to a first embodiment of the present invention.
Figure 1B:
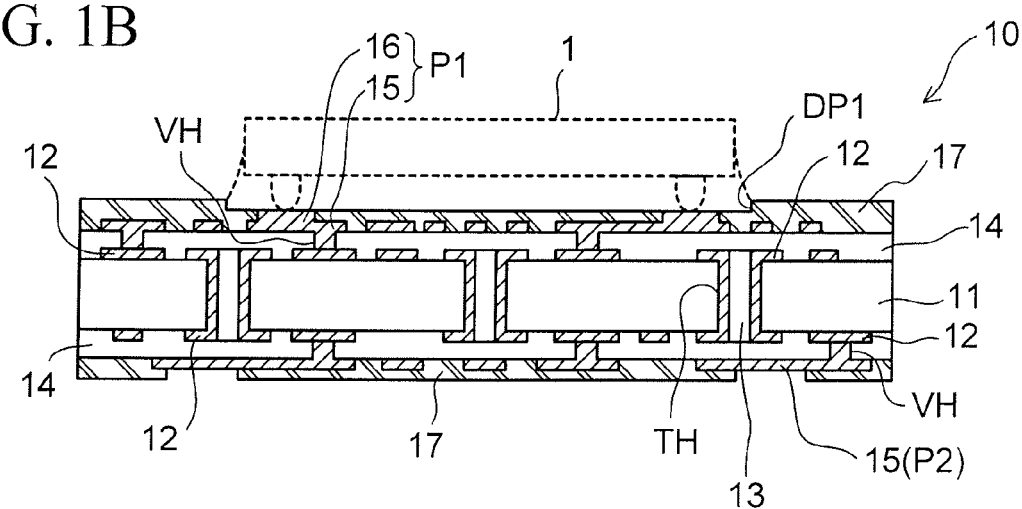
Figure 1C:
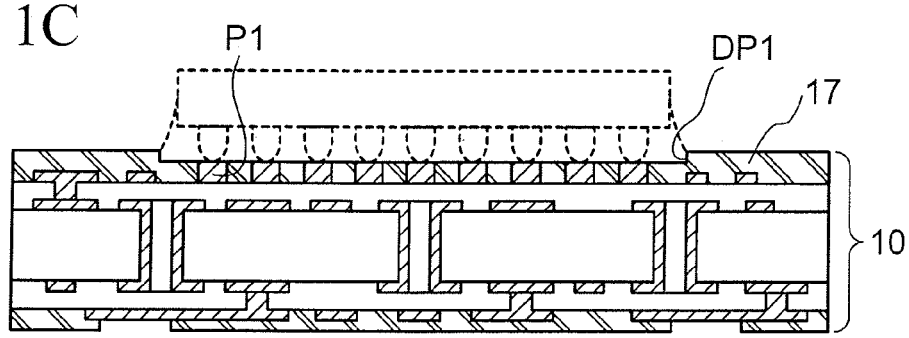

FIGS. 1A to 1C show a configuration of a wiring board (semiconductor package) according to a first embodiment of the present invention. FIG. 1A shows the wiring board as viewed from above. FIG. 1B shows the wiring board as viewed in a vertical cross-sectional view taken along the line A-A' of FIG. 1A. FIG. 1O shows the wiring board when viewed in a vertical cross-sectional view taken along the line B-B' of FIG. 1A.

A wiring board (semiconductor package) 10 according to the first embodiment is for use in flip-chip mounting of a semiconductor integrated circuit device (semiconductor chip 1 illustrated by a broken line) having a peripheral type terminal arrangement as illustrated.

The wiring board 10 of the present embodiment is basically configured to have a multi-layer wiring board fabricated by using a general build-up method. In the illustrated example, wiring layers (wiring patterns) 12 are formed on both surfaces of a core substrate 11 serving as a support base member, respectively, each of the wiring layers 12 being the first layer formed in a required shape by patterning. The wiring patterns 12 on the both surfaces are electrically connected to each other via conductors (plating films) each formed on the inner surface of a through hole TH formed in a required position of the core substrate 11. In addition, the inside of the through hole TH is filled with an insulating member (resin) 13.

Furthermore, insulating layers (resin layers) 14 are formed on the both surfaces of the core substrate 11 so as to cover the wiring layers 12, respectively. In addition, wiring layers (wiring patterns) 15 are formed on the insulating layers 14, respectively, each of the wiring layers 15 being the second layer formed in a required shape by patterning. Each of the wiring patterns 15 is electrically connected to a corresponding one of the wiring layers 12 through conductors (vias) each used to fill the inside of a via hole VH formed at a required position at each of the insulating layers 14. Here, the insulating layers 14 are the underlying layers of the respective wiring patterns 15, and the wiring layers 12 are the underlying layers of the respective insulating layers 14. In this embodiment, the wiring layers 15, which are the second layers, form the outermost insulating layers, respectively. Note that, although it is not shown in the illustrated example, a seed layer is interposed between each of the insulating layers 14 and the wiring layers 15, as will be described later.

The portions of pad P1 and P2 for use in external connection are defined at required positions of the outermost wiring layers 15, respectively. Furthermore, conductive layers 16, which characterize the present embodiment, are laminated on the portions of the pads P1, respectively, of the wiring layer 15 on a surface side (upper side in the illustrated example) where the semiconductor chip 1 is mounted. Namely, the conductive layers 16 are laminated on and integrated with the respective portions of the wiring layer 15, which is the underlying layer of the conductive layers 16. In this manner, only the pad potions P1 are thus formed thicker than the other wiring portion.

Moreover, a solder resist layer (outermost insulating layer) 17 serving as a protection film is formed on the uppermost surface side where the semiconductor chip 1 is mounted. Then, a concave portion DP1 characterizing the present invention is formed at the solder resist layer 17. The concave portion DP1 is formed by scraping off a portion of the solder resist layer, which corresponds to the concave portion DP1 (reducing the thickness of the portion), by sand blast or the like, the portion of the solder resist layer 17 formed to have a required thickness as will be described later. Namely, the concave portion DP1 having a flat bottom surface obtained by scraping off the portion of the solder resist layer 17 into the step-like shape is formed at the same portion of the solder resist layer 17. The concave portion DP1 defines the chip mounting area and is formed in a size (square in a plan view as shown in FIG. 1A, with each side of length W2) slightly larger than a size (also square with each side of length W1) of the semiconductor chip 1 to be mounted thereon.

The pads P1 (conductive layers 16) are exposed in the concave portion (chip mounting area) DP1 and are formed so that the surfaces of the pads P1 are flush with the surface of the solder resist layer 17 in the concave portion DP1. As shown by broken lines in the drawings, electrode terminals of the chip 1 are flip-chip bonded to the pads P1 via solder bumps or the like, respectively.

As described above, formation of the concave portion DP1 in a size slightly larger than the size of the chip 1 at the outermost insulating layer (solder resist layer) 17 on the one of the surface sides enables the concave portion DP1 to function as a "dam" to block resin overflowing from a gap between the package 10 and the chip 1 to the periphery thereof when the chip 1 is mounted on the package 10, and underfill resin is filled into the gap therebetween.

Likewise, a solder resist layer (outermost insulating layer) 17 serving as a protection film is also formed on the outermost surface on a surface side opposite to the surface side where the semiconductor chip 1 is mounted. The solder resist layer 17 is formed so as to cover the surface of the outermost wiring layer 15 while exposing the portions of the pads P2 each defined at a required position of the outermost insulating layer 15. External connection terminals such as solder balls for use in mounting of the package 10 on a motherboard or the like are bonded to the pads P2 exposed from the solder resist layer 17.

The specific material, size, thickness and the like of each of the members forming the wiring board (semiconductor package) 10 according to the present embodiment are described in detail in relation to the process described later.

Figure 2:
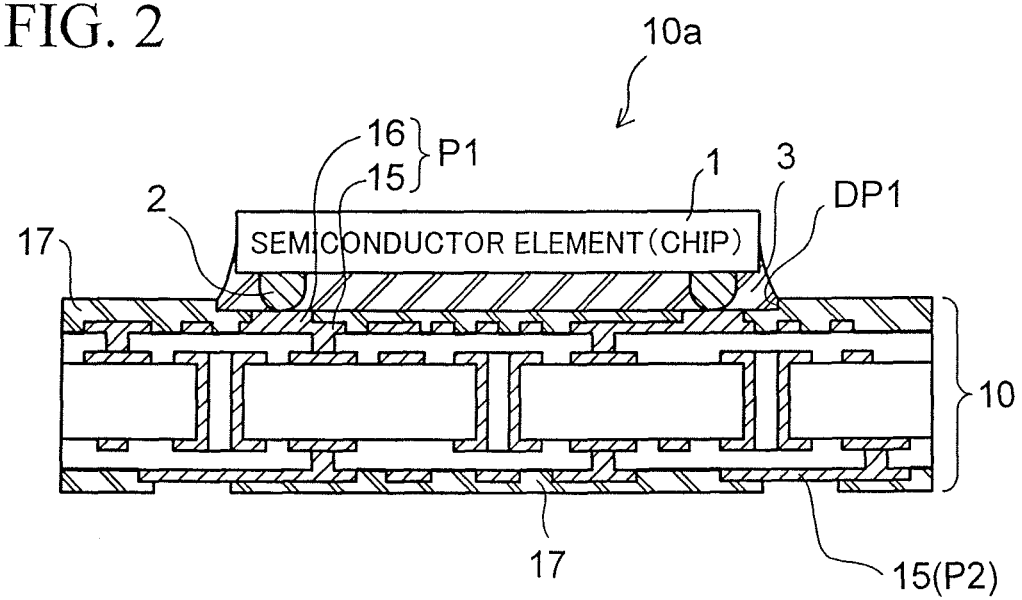
FIG. 2 is a cross-sectional view showing a state where a semiconductor element (electronic component) is mounted on the wiring board in FIGS. 1A to 1C)

FIG. 2 shows a cross-sectional structure of a state where the semiconductor element (chip) 1 as an electronic component is mounted on the wiring board 10 of the present embodiment (case where the wiring board 10 is configured as a semiconductor device 10a).

The semiconductor chip 1 is flip-chip bonded to the pads P1 (conductive layers 16) exposed in the concave portion DP1 formed at the solder resist layer 17 on the chip mounting surface side via electrode terminals 2 (such as solder bumps) of the semiconductor chip 1 as illustrated. Furthermore, the chip 1 is fixed to the wiring board 10 by filling underfill resin 3 (thermosetting epoxy-based resin or the like) into the gap between the wiring board 10 and the chip 1 mounted in the concave portion DP1 and then causing the underfill resin 3 to be thermally cured.

Meanwhile, external connection terminals such as solder balls or pins are bonded to the pads P2 (wiring layer 15) by reflow soldering or the like as appropriate, the pads P2 exposed from the solder resist layer 17 on the surface side (external connection terminal bonding surface) opposite to the chip mounting surface side. Here, the external connection terminals such as solder balls are not necessarily bonded to the pads P2, respectively. Alternatively, the form of a land grid array (LGA) using the pads P2 themselves as the external connection terminals can be employed as illustrated.

Next, a description is given of a method of manufacturing the wiring board (semiconductor package) 10 according to the first embodiment with reference to FIGS. 3A to 5D provided for showing an example of the manufacturing steps.

Figure 3A:
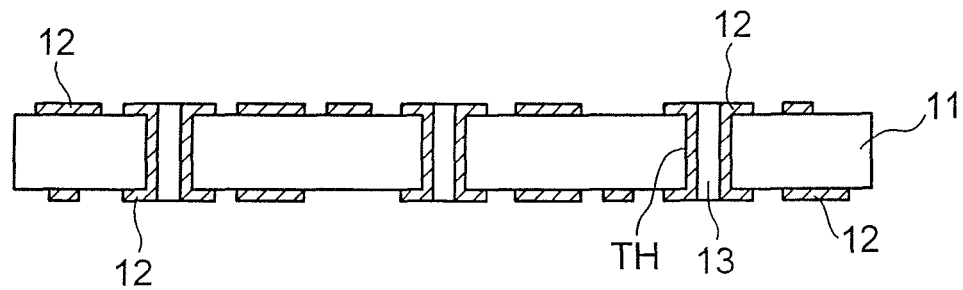
FIGS. 3A to 3D are cross-sectional views showing manufacturing steps of the wiring board in FIGS. 1A to 1C.

First, a substrate serving as the base of the wiring board 10 is prepared in the initial step (FIG. 3A). A copper clad-laminate used in a general printed wiring board is used for this base substrate. Namely, a substrate obtained by the following process is used as the core substrate 11. Specifically, a required number of prepregs (e.g., a bonding sheet in a semi-cured state, formed by impregnating a thermosetting resin such as an epoxy-based resin or a polyimide-based resin into a glass fiber which is a reinforcement material) are superimposed one on top of another. Then, copper foils are superimposed on the both surfaces of the superimposed prepregs, respectively, and heat and pressure is applied thereto. Next, the through holes TH are formed at required positions of the core substrate 11 by drilling. Thereafter, the both surfaces (on the copper foils) of the core substrate 11 and also the inside of the through holes TH (formation of Cu plated film) are provided with electroless copper (Cu) plating and electrolytic Cu plating, sequentially. Furthermore, after the inside of the through holes TH are filled with resin 13, the wiring layers (wiring pattern) 12 each being the first layer are formed by patterning the Cu plated films formed on the both surfaces of the core substrate 11 into required shapes (etching process), respectively, by a subtractive method.

In the next step (FIG. 3B), the insulating layers each made of epoxy-based resin, polyimide-based resin or the like are formed on the both surfaces of the core substrate 11 so as to cover the wiring layers 12, respectively. For example, an epoxy-based resin film is laminated on the core substrate 11 and the wiring layer 12, and then, the resin film is cured by heating process at a temperature of 130 to 150° C. while the resin film is pressed. Thereby, the resin layer (insulating layer 14) can be formed.

In the next step (See FIG. 3C), the via holes VH extending to a corresponding one of the underlying wiring layers (portions of the pads) 12 of the insulating layers 14 are formed at predetermined positions of each of the resin layers (insulating layers) 14 on the both surfaces by a hole making process with a $CO_2$ laser, an excimer laser or the like. In the illustrated example, three via holes VH are formed on each of the upper and lower surfaces. When the insulating layers 14 are formed by using a photosensitive resin, the via holes VH can be formed by using a photolithography technique instead of the laser processing. When the via holes VH are formed by using the laser processing, a portion of the resin melted due to the heat during laser radiation often attaches to the bottom surface (on the wiring layer 12) as resin residue (smear). When the smear is attached to the bottom surface, the smear becomes a factor to cause a conduction failure between the wiring layer 12 and the conductive layer (wiring layer) formed thereon.

In the next step (FIG. 3D), processing (desmear) to remove the resin residue (smear) attached to the bottom surfaces (on the wiring layer 12) of the via holes VH is performed first. A potassium permanganate method is used to perform the processing (desmear), for example. After the surfaces of the wiring layers 12 are completely exposed by the desmear processing, a seed layer (plating power feeding layer) SD is formed, by non-electrolytic plating, on each of the entire surfaces (on the insulating layers 14) including the portions of the wiring layers 12, which are exposed at the bottom surfaces of the via holes VH, respectively.

In the next step (See FIG. 4A), the wiring layers (wiring patterns) 15 are formed on the seed layers SD on the both surfaces, respectively. The wiring layers 15 are the second layers each connected to a corresponding one of the wiring layers (portions of the pads) 12 by filling the inside of the via holes VH (formation of vias), the wiring layers 12 being the underlying layers of the respective wiring layers 15. A semi-additive method is used in the formation of the wiring layers 15, for example.

Specifically, a resist mask for plating is formed on each of the seed layers SD using a patterning material, first, and then required portions of the resist mask are opened. Namely, resist layers (not shown) are formed, each of the resist layers having opening portions which are formed by patterning in accordance with the pattern of a corresponding one of the wiring layers 15 to be formed.

A photosensitive dry film (of a structure in which a resist material is held between a polyester cover sheet and a polyethylene separator sheet) or a liquid photoresist (liquid resist such as a novolac-based resin or an epoxy-based resin) can be used as the patterning material. For example, when the dry film is used, the dry film is attached onto the seed layer SD by thermal compression bonding. Then, the dry film is cured by subjecting the dry film to exposure under ultraviolet (UV) irradiation using a mask (not illustrated) formed in a required shape by patterning. Furthermore, the cured portion is etched away using a predetermined developing solution. A resist layer (not shown) having opening portions in accordance with the required shape of the wiring layer 15 is thus formed. The resist layer can be formed through the same steps when the liquid photoresist is used as well.

Next, each of the wiring layers (wiring pattern) 15 is formed on a corresponding one of the seed layers (Cu) SD by electrolytic Cu plating using the seed layer SD as a power feeding layer, each of the seed layers SD exposed from the opening portions of a corresponding one of the resist films (resist masks). The resist masks are then removed. When a dry film is used as the plating resist, an alkaline chemical liquid such as sodium hydroxide or a monoethanolamine-based liquid can be used for removal, for example. In addition, when a liquid resist such as a novolac-based resin or an epoxy-based resin is used as the plating resist, acetone, alcohol or the like can be used for removal.

Figure 4A:
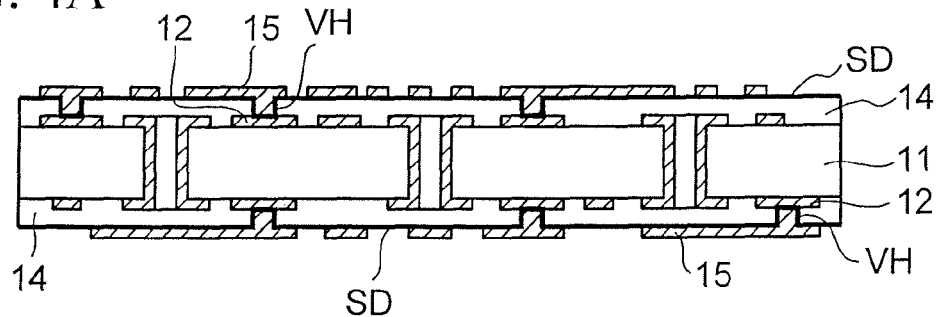
FIGS. 4A to 4D are cross-sectional views showing manufacturing steps subsequent to the manufacturing steps in FIGS. 3A and 3D.

In the aforementioned manner, the wiring layers (wiring patterns) 15, which are the second layers, as shown in FIG. 4A are formed. In this stage, the seed layers SD are left without removal.

In this embodiment, the wiring layers 15, which are the second layers, form the outermost layers, respectively, as described above, but a further increase in the number of layers can be attempted as appropriate. In this case, the insulating layers and the wiring layers are alternately stacked one on top of another in the same manner as the processing performed in the steps of FIG. 3B to FIG. 4A until the required number of layers are stacked.

In the next step (FIG. 4B), resist masks are formed on the seed layers SD and the wiring layers 15 on the both surfaces, respectively, by using a patterning material. As to one of the resist masks on the chip mounting surface side (upper side in the illustrated example), required positions of the resist mask are opened (formation of a resist layer R1 provided with opening portions OP1). The opening portions OP1 are formed by patterning in accordance with the shape of the pads P1 (each being a portion defined at a portion of the wiring layer 15) to be formed. The shape of each of the pads P1 to be formed in this embodiment is a "rectangle" (See FIG. 1A).

The photosensitive dry film used in the step of FIG. 4A or the liquid photoresist can be used as the patterning material. Moreover, the patterning method for the resist layer R1 is basically the same as the processing performed in the step of FIG. 4A, so that the description thereof is omitted herein.

In the next step (FIG. 4C), the portions of the pads P1 of the wiring layer 15, which are exposed through the opening portions OP1, respectively, of the resist layer R1 on the chip mounting surface side, are provided with electrolytic Cu plating using the seed layer (Cu) SD as a power feeding layer, the seed layer (Cu) being the underlying layer of the wiring layer 15. Thereby, conductive layers 16 are formed. Namely, the conductive layers (Cu) 16 are laminated on and integrated with the portions of the wiring layer (Cu) 15, which is the underlying layer thereof to form the pads P1, respectively. Thereby, only the portions of the pads P1 are formed thicker than the other wiring portion (wiring layer 15).

In the next step (FIG. 4D), the resist masks (resist layers R1 in FIG. 4C) on the both surfaces are removed in the same manner as the processing performed in the step of FIG. 4A. Furthermore, the exposed portions of the seed layers (Cu) SD are subjected to etching. Wet etching using a mixed aqueous solution of sulfuric acid and hydrogen peroxide water, or the like is used for removal, for example.

Thereby, the following structure is obtained. In the structure, the wiring layers (wiring patterns) 15 each being the second layer are formed on the both surfaces, respectively, as illustrated, and only the portions of the pads P1 on the chip mounting surface side are formed thicker than the other wiring portion (wiring layer 15). Note that, for simplicity of the illustration, illustration of the seed layers SD is omitted in the next step or later.

In the next step (FIG. 5A), solder resist layers 17A and 17 are formed so as to cover the wiring layers (including the conductive layers 16) formed on the both surfaces, respectively. In this case, the solder resist layer 17A on the chip mounting surface side is formed so as to cover the entire surface of the wiring layer 15, and the solder resist layer 17 on the external connection terminal bonding surface side is formed so as to cover the surface of the wiring layer 15 while exposing the portions of pads P2 each defined at a required position of the wiring layer 15 as illustrated. Each of the solder resist layers 17 and 17A is formed by laminating a solder resist film on a corresponding one of the wiring layers 15 or coating the wiring layer with a liquid solder resist, for example. Moreover, the solder resist layer on the external connection terminal bonding surface side is formed by forming the resist by patterning in accordance with the shape of the pads P2. Thereby, the pads P2 are exposed through the opening portions of the solder resist layer 17 on the external connection terminal bonding surface side.

The thickness of the portions of the solder resist layer 17A formed on the respective pads P1 on the chip mounting surface side defines the depth of the dam (concave portion DP1) to be formed. For this reason, the thickness thereof is selected as appropriate in consideration of the size of the chip to be mounted, and the amount of resin overflowing from the gap between the chip and the wiring board to the periphery thereof when the underfill resin is filled into the gap at the time of mounting the chip.

Note that, the pads P2 on the surface side opposite to the chip mounting surface side are preferably provided with gold (Au) plating in order to improve contact properties because the external connection terminals such as solder balls or pins for use in mounting of the package 10 onto a motherboard or the like. In this case, the pads (Cu) P2 are first provided with nickel (Ni) plating and then provided with Au plating. Namely, a conductive layer (not shown) formed of a two-layer structure including a Ni layer and an Au layer is formed on each of the pads P2.

In the next step (FIG. 5B), a resist mask is formed on the solder resist layer 17A on the chip mounting surface side and a required portion of the resist mask is opened (formation of a resist layer R2 having an opening portion OP2). The opening portion OP2 is formed by patterning in accordance with the shape of the concave portion DP1 to be formed.

As the material of the resist mask, the photosensitive dry film or the liquid photoresist used in the step of FIG. 4A can be used. Alternatively, a resist mask of dry film type having sand blast resistant properties can be also used. Moreover, since the patterning method for the resist layer R2 is basically the same as the processing performed in the step of FIG. 4A, the description thereof is omitted herein.

Figure 5A:
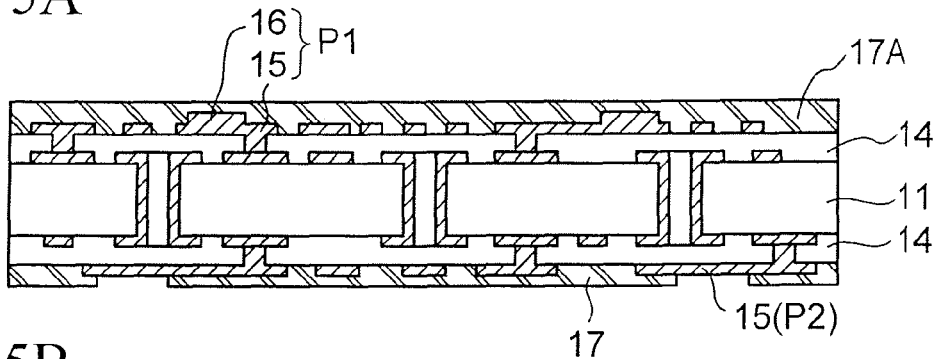
FIGS. 5A to 5D are cross-sectional views showing manufacturing steps subsequent to the manufacturing steps in FIGS. 4A and 4D.
Figure 5B:
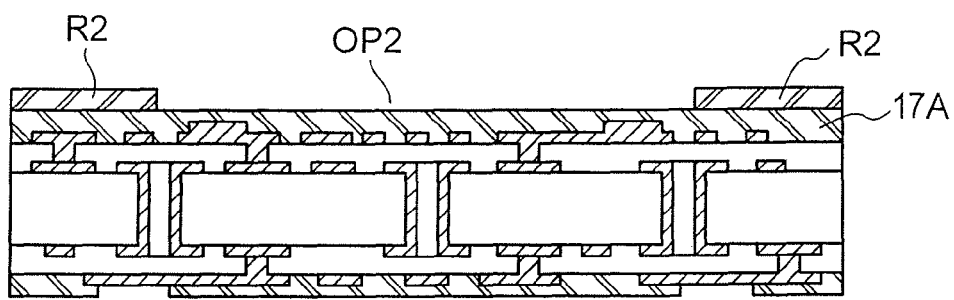
Figure 5C:
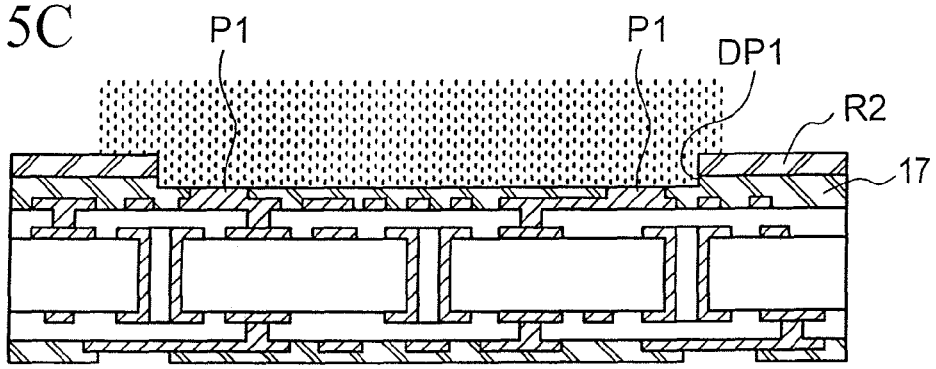

In the next step (FIG. 5C), sand blast is performed by using the resist layer R2 as a mask with respect to the portion of the solder resist layer 17A, which is exposed through the opening portion OP2 of the resist layer R2 (the processing is shown by dotted lines in FIG. 5C as an image). Namely, the exposed portion of the solder resist layer 17A through the opening portion OP2 is scraped off into a step-like shape (thickness of the portion is entirely reduced) by the sand blast. In this manner, the concave portion DP1 having a flat bottom surface is formed, and the surfaces of the respective pads P1 are collectively exposed at the flat bottom surface (surface of the solder resist layer 17).

In this embodiment, the surface of the solder resist layer 17A is processed by sand blast. The processing rate of the sand blast differs depending on the malleability of the material to be processed. The processing rate thereof becomes large for a material whose brittleness is relatively large (such as cured resin) while the processing rate becomes small for a material whose brittleness is relatively small (such as metal). Accordingly, when the exposed portion of the solder resist layer 17A is processed by sand blast while the amount of the portion to be processed (thickness of the solder resist layer to be scraped off) and the processing rate are appropriately adjusted, the surfaces of the respective pads P1 can be exposed with high accuracy on the bottom surface of the formed concave portion DP1.

Note that, other than the sand blast, another processing technique such as a plasma etching technique can be alternatively used. However, it is preferable to use the sand blast because: a sufficient selection ratio can be secured; high processing accuracy can be obtained; the technique is excellent in work efficiency; and the like.

In the final step (FIG. 5D), the resist mask (the resist layer R2 in FIG. 5C) is removed in the same manner as the removal processing of the resist mask, which is performed in the step of FIG. 4A. In addition, pre-coating solder (not shown) is attached to the pads P1 exposed at the surface of the solder resist layer 17 on the chip mounting surface side. This solder is provided for facilitating the connection to the electrode terminals (such as solder bumps) of the chip to be mounted, in consideration of convenience or the like of the delivery destination.

Through the aforementioned steps, the wiring board (semiconductor package) 10 according to the first embodiment is fabricated.

As described above, according to the first embodiment (FIGS. 1A to 5D), the concave portion DP1 is formed in the size W2, which is larger than the size W1 being the size of the chip 1 to be mounted thereon. This concave portion DP1 is formed at a predetermined position of the outermost insulating layer (solder resist layer 17) on the chip mounting surface side of the wiring board 10. In addition, the pads P1 for use in flip-chip bonding are exposed in the concave portion DP1, and the surfaces of the pads P1 are formed so as to be flush with the surface (surface of the board onto which the underfill resin 3 flows, the underfill resin 3 being filled after the mounting of the chip) of the solder resist layer 17 in the concave portion DP1.

Accordingly, the surfaces of the pads P1 and the surface of the solder resist layer 17 are flush with each other in the concave portion DP1 (Namely, there is a flat surface with no irregularities in the area in which the underfill resin 3 injected from the opening portion around the chip flows to the inside of the opening and is filled). For this reason, the fluidity of the underfill resin 3 in the area is increased when the underfill resin 3 is filled into a gap between the semiconductor chip 1 mounted in the concave portion DP1 and the wiring board 10 (See FIG. 2). Thereby, the area can be smoothly filled with the resin, and generation of voids can be effectively suppressed. As a result, a sufficient bonding strength between the chip 1 and the wiring board 10 can be obtained, thus improving the connection reliability.

In addition, the size of the area (concave portion DP1) which is filled with the underfill resin 3 is larger than the size of the chip 1 (W2>W1 in FIG. 1A), so that a portion of the underfill resin 3, which overflows from the gap between the chip 1 and the wiring board 10 after the filling of the resin, can be blocked by the step portion (dam) of the concave portion DP1 as shown in FIG. 2. Namely, the underfill resin 3 overflowing between the chip and the board to the periphery thereof is limited within a predetermined range, whereby, other circuit elements, pads or the like arranged around the chip can be prevented from being negatively influenced.

If a dam structure having the equivalent function as the concave portion DP1 of the present embodiment is formed in the prior art, an additional process is required for forming the dam portion on the outermost insulating layer (solder resist layer) of the substrate after the formation of the insulating layer (the additional process herein includes: patterning of a photosensitive insulating resin by photolithography; coating with an insulating resin by a screen printing method; forming of a plate member into a frame shape and attaching thereof; and the like). In addition, if the portions of pads each defined at a portion of the outermost wiring layer are exposed so as to be flush with the surface of the outermost insulating layer (solder resist layer), the following process is required as described in JPP (Kokai) 2006-344664 (FIG. 8). Specifically, the process includes coating of a belt like wiring conductors 5a and conductive protrusions 12 (pads) with resin 6a for the solder resist layer first, and then grinding of the resin 6a until the upper surfaces of the conductive protrusions are exposed. Moreover, in order to fabricate the same dam structure in the wiring board having a flat board surface as described above, another process for forming a dam portion on the board is further required.

On the other hand, in the process according to the present embodiment (See FIGS. 5A to 5C), the sand blast is performed, by using a mask formed in a required shape by patterning (resist layer R2), with respect to the solder resist layer 17A formed so as to cover the uppermost wiring layer 15 on the chip mounting surface side and the conductive layers 16 (the portions of the pads P1). The portion of the solder resist layer 17A is then removed into a step-like shape. Thereby, the concave portion DP1 having a dam function can be formed, and at the same time, the following structure can be obtained: the surfaces of the pads P1 exposed in the concave portion DP1 and the surface of the solder resist layer 17 are flush with each other (there is a flat surface with no irregularities). Namely, a required dam structure can be easily formed without the necessity of the additional steps required in the process of the prior art and the costs associated therewith.

Second Embodiment

See FIGS. 6a to 9d

Figure 6A:
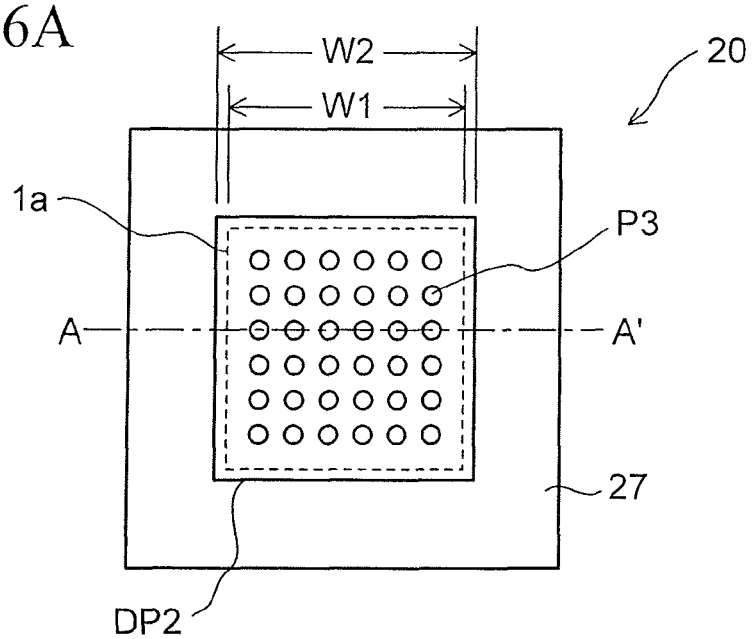
FIGS. 6A and 6B are diagrams for showing a configuration of a wiring board (semiconductor package) according to a second embodiment of the present invention.
Figure 6B:
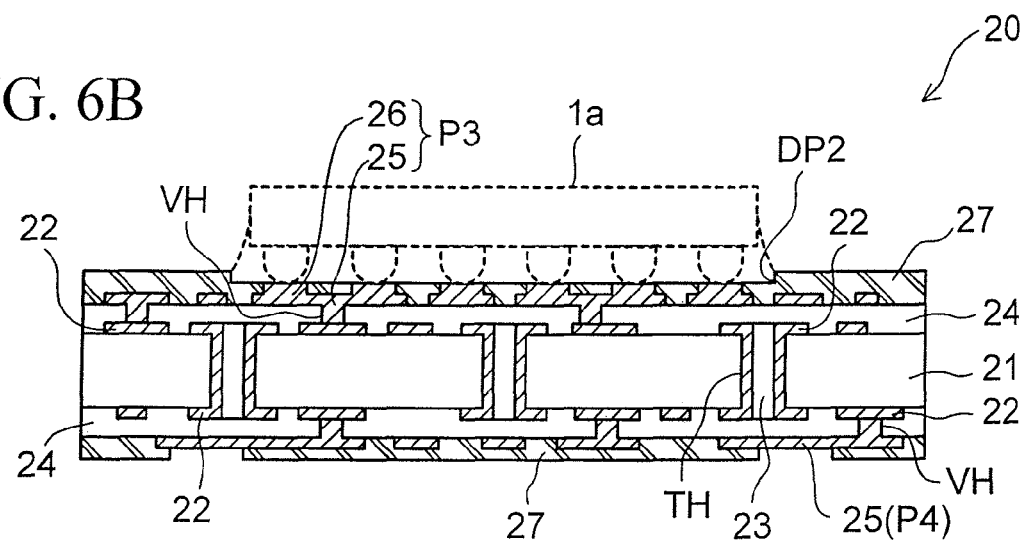

FIGS. 6A and 6B are diagrams for showing a configuration of a wiring board (semiconductor package) according to a second embodiment of the present invention. FIG. 6A shows the configuration when the wiring board is viewed from above, and FIG. 6B shows the configuration when the wiring board is viewed in a cross section taken along the like A-A' of FIG. 6A, likewise.

As compared with the configuration of the wiring board 10 according to the first embodiment (FIGS. 1A to 1C), a wiring board (semiconductor package) 20 according to the second embodiment is different in that pads P3 for flip-chip bonding (shape of each of the pads P3 is a "circle") are arranged in a matrix so as to match the terminal arrangement (matrix type) of a semiconductor chip 1a to be mounted thereon. The other configuration of the wiring board 20 is basically the same as the configuration of the wiring board 10 according to the first embodiment.

Namely, the wiring board 20 according to the present embodiment also includes: a core substrate 21; wiring layers 22 formed on both surfaces of the core substrate 21, respectively, via through holes TH (Cu plated films formed on inner surfaces of the core substrate 21) formed inside the core substrate 21; resin 23 used to fill the inside of each of the through holes TH; insulating layers (resin layers) 24 formed on the both surfaces of the core substrate 21 so as to cover the wiring layers 22, respectively; wiring layers each formed so as to be connected with a corresponding one of the wiring layers 22, which are the underlying layers of the respective insulating layers 24, through via holes VH (conductors filled inside the insulating layers 24) formed in each of the insulating layers 24; and conductive layers 26 laminated on the portions of the pads P3 of the wiring layers 25, respectively, on the chip mounting surface side. Then, the conductive layers 26 are integrated with the portions of the wiring layers 25, which is the underlying layer thereof, whereby only the portions of the pads P3 are formed thicker than the other wiring portion.

Furthermore, a concave portion DP2 which defines the chip mounting area is formed in the size W2 larger than the size W1 of the chip 1a to be mounted thereon at a solder resist layer (outermost insulating layer) formed on the chip mounting surface side. In addition, the pads P3 are formed, so that the pads P3 are exposed in the concave portion DP2 and that the surfaces of the pads P3 are flush with the surface of the solder resist layer 27 in the concave portion DP2. A solder resist layer (outermost insulating layer) 27 is also formed on the surface side opposite to the chip mounting surface side so as to cover the surface of a corresponding one of the outermost wiring layers 25 while exposing the portions of pads P4 each defined at portions of the outermost wiring layers 25.

Figure 7:
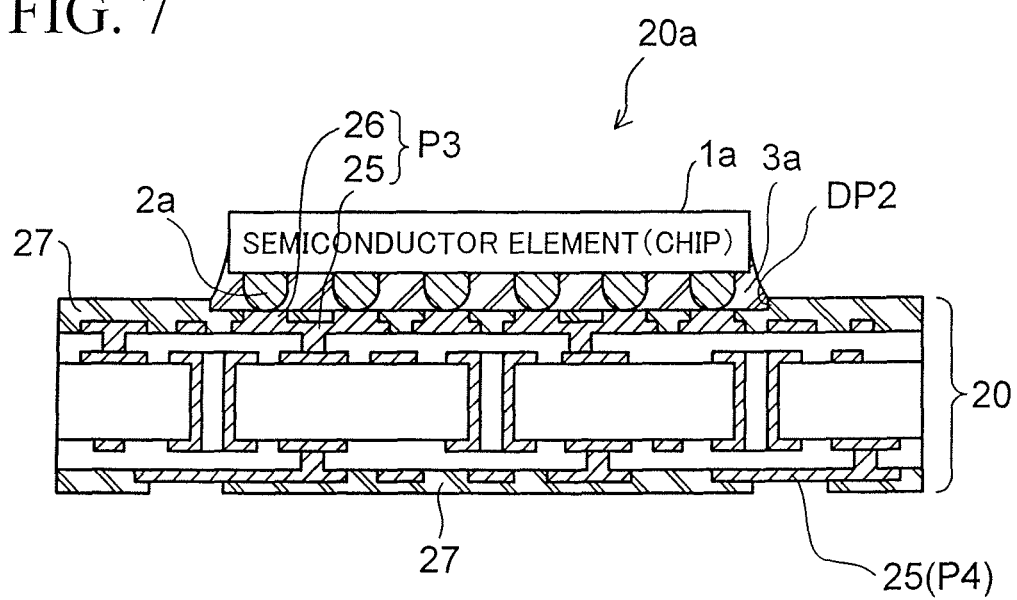
FIG. 7 is a cross-sectional view showing a state where a semiconductor element (electronic component) is mounted on the wiring board in FIGS. 6A and 6B)
Figure 8A:
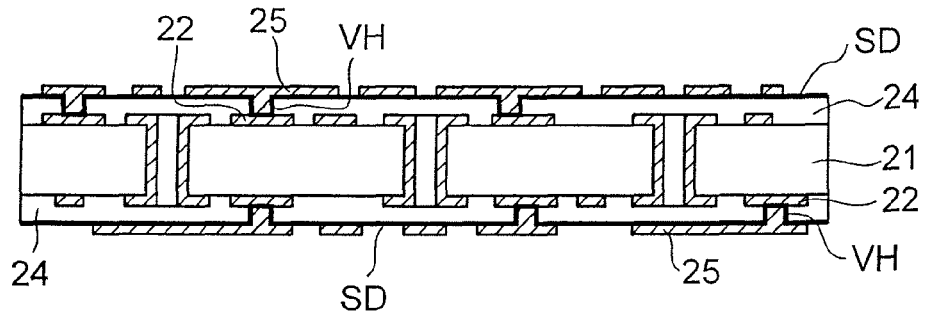
FIGS. 8A to 8D are cross-sectional views showing manufacturing steps of the wiring board in FIGS. 6A and 6B.
Figure 8B:
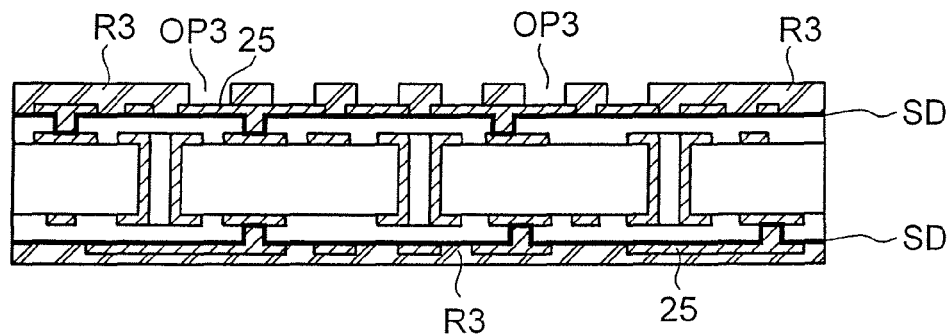
Figure 8C:
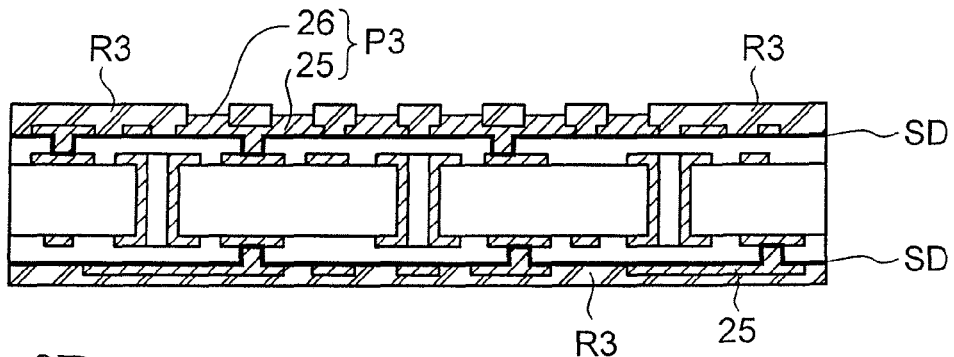
Figure 8D:
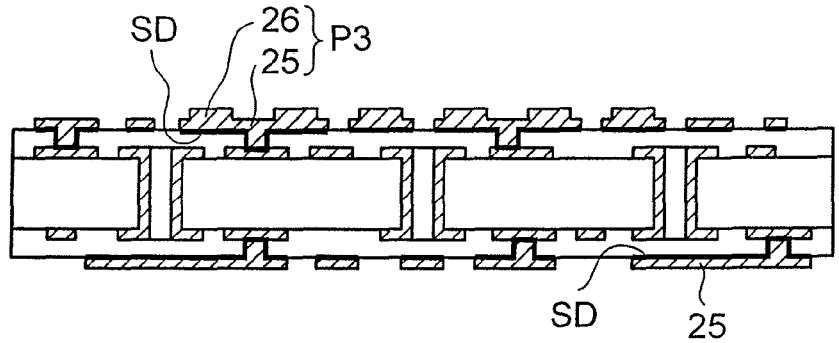
Figure 9A:
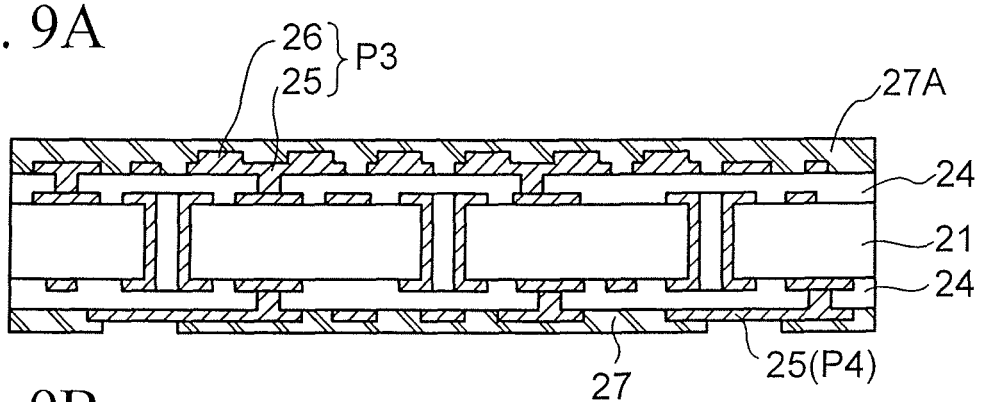
FIGS. 9A to 9D are cross-sectional views showing manufacturing steps subsequent to the manufacturing steps in FIGS. 8A to 8D.
Figure 9B:
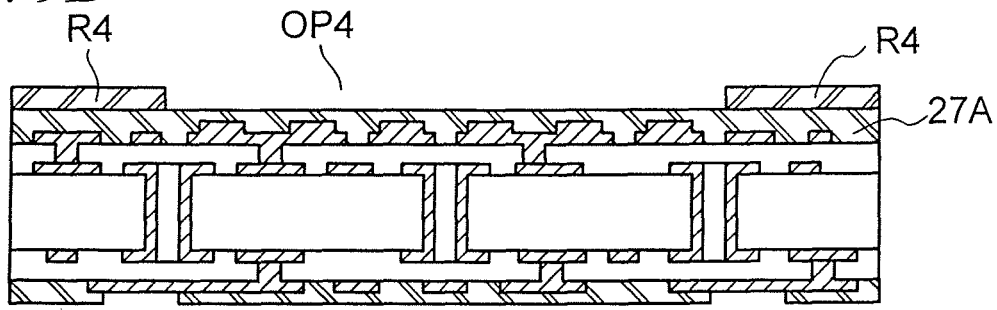
Figure 9C:
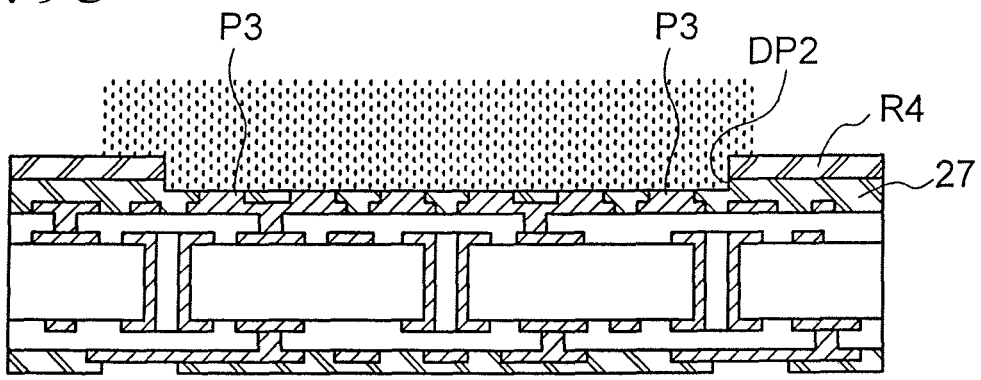
Figure 9D:
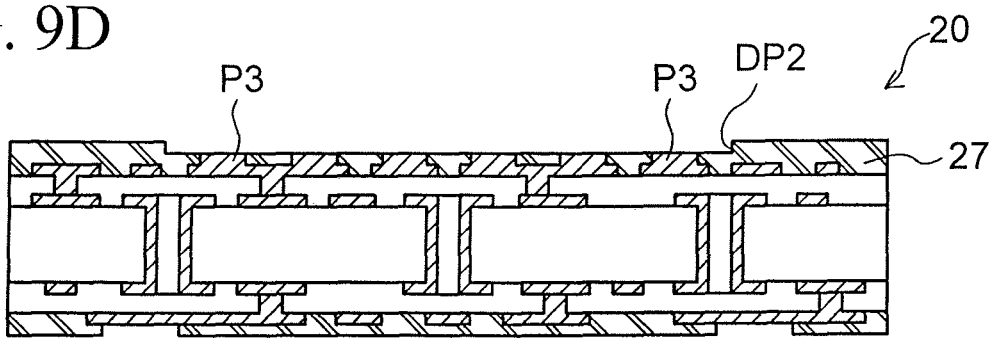

FIG. 7 shows a cross-sectional structure of a state where the semiconductor element (chip) 1a as an electronic component is mounted on the wiring board 20 of the present embodiment (case where the wiring board 20 is configured as a semiconductor device 20a). In this embodiment as well, the semiconductor chip 1a is flip-chip bonded to the pads P3 (conductive layers 26) exposed in the concave portion DP2 via electrode terminals 2a of the semiconductor chip 1a, respectively, the concave portion DP2 formed at the solder resist layer 27 on the chip mounting surface side. Furthermore, underfill resin 3a is filled into a gap between the chip 1a mounted in the concave portion DP2 and the wiring board 20. The underfill resin 3a is then thermally cured, thereby, fixing the chip 1a to the wiring board 20. On the other hand, external connection terminals such as solder balls or pins are bonded to the pads P4 (wiring layers 25) by reflow soldering or the like, as appropriate, the pads P4 exposed from the solder resist layer 27 on the surface side opposite to the chip mounting surface side.

Next, a description is given of a method of manufacturing the wiring board (semiconductor package) 20 according to the second embodiment with reference to FIGS. 8A to 9D provided for showing an example of the manufacturing steps of the method. In order to avoid a redundant description for the same processing as the processing performed in the steps of the process (FIGS. 3A to 5D) according to the first embodiment, a description is given of only different processing in a simple manner.

First, in the same manner as the processing performed in the step of FIG. 4A, the wiring layers (wiring patterns) 25 are formed on the seed layers SD on the both surfaces, respectively, in the initial step (FIG. 8A) with respect to the structure obtained through the same processing as the processing performed in the steps of FIGS. 3A to 3D. The wiring layers 25 are the second layers each connected to a corresponding one of the wiring layers (portions of the pads) 22 by filling the inside of the via holes VH (formation of vias), the wiring layers 22 being the underlying layers of the respective wiring layers 25. A semi-additive method is used in the formation of the wiring layers 25.

Figure 4B:
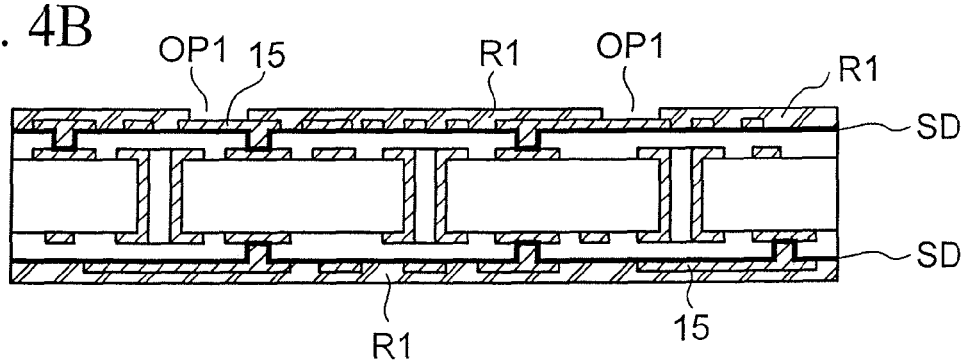

In the next step (FIG. 8B), in the same manner as the processing performed in the step of FIG. 4B, resist masks are formed on the seed layers SD and the wiring layers 25 on the both surfaces, respectively. As to one of the resist masks on the chip mounting surface side, required positions of the resist mask are opened (formation of a resist layer R3 provided with opening portions OP3). The opening portions OP1 are formed by patterning in accordance with the shape ("circle" in the present embodiment) of the pads P3 (portions each defined at portions of the wiring layers 25) to be formed.

Figure 4C:
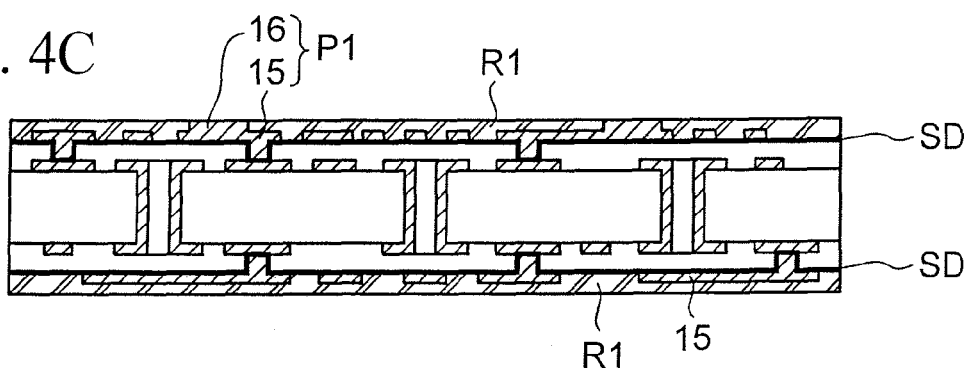

In the next step (FIG. 8C), in the same manner as the processing performed in the step of FIG. 4C, the portions of the pads P3 of the wiring layers 25, which are exposed through the opening portions OP3, respectively, of the resist layer R3 on the chip mounting surface side, are provided with electrolytic Cu plating using the seed layer (Cu) SD as a power feeding layer, the seed layer (Cu) being the underlying layer of the wiring layers 25. Thereby, conductive layers 26 are formed. Namely, the conductive layers (Cu) 26 are laminated on and integrated with the portions of the wiring layers (Cu) 25, which is the underlying layer thereof, so as to form the pads P3, respectively. Thereby, only the portions of the pads P3 are formed thicker than the other wiring portion (wiring layers 25).

Figure 4D:
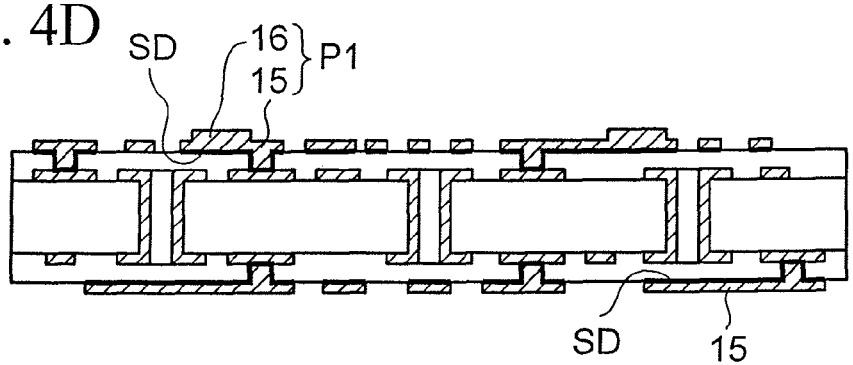

In the next step (FIG. 8D), the resist masks (resist layers R3 in FIG. 8C) on the both surfaces are removed in the same manner as the processing performed in the step of FIG. 4D. Furthermore, the exposed portions of the seed layers (Cu) SD are subjected to etching.

Thereby, the following structure is obtained. Specifically, in the structure, the wiring layers 25 each being the second layer are formed on the both surfaces, respectively, as illustrated, and only the portions of the pads P3 on the chip mounting surface side are formed thicker than the other wiring portion (wiring layers 25). Also, for simplicity of the illustration, illustration of the seed layers SD is omitted in the next step or later.

In the next step (FIG. 9A), in the same manner as the processing performed in the step of FIG. 5A, solder resist layers 27A and 27 are formed so as to cover the wiring layers 25 (including the conductive layers 26) formed on the both surfaces, respectively. Namely, the solder resist layer 27A on the chip mounting surface side is formed so as to cover the entire surface of the wiring layer 25, and the solder resist layer 27 on the external connection terminal bonding surface side is formed so as to cover the surface of the wiring layer 25 while exposing the portions of pads P4 each defined at a required position of the wiring layer 25 as illustrated. The thickness of the portions of the solder resist layer 27A formed on the respective pads P3 on the chip mounting surface side defines the depth of the dam (concave portion DP2) to be formed, so that the thickness thereof is selected as appropriate in consideration of the size of the chip to be mounted, and the amount of resin overflowing from the gap between the chip and the wiring board to the periphery thereof when the underfill resin is filled into the gap at the time of mounting the chip. In addition, the pads P4 on the surface side opposite to the chip mounting surface side are provided with Ni plating and Au plating in this order, as appropriate.

In the next step (FIG. 9B), in the same manner as the processing performed in the step of FIG. 5B, a resist mask is formed on the solder resist layer 27A on the chip mounting surface side, and a required position of the resist mask is opened (formation of a resist layer R4 provided with an opening portion OP4). The opening portion OP4 is formed by patterning in accordance with the shape of the concave portion DP2 to be formed.

In the next step (FIG. 9C), in the same manner as the processing performed in the step of FIG. 5C, sand blast is performed by using the resist layer R4 as a mask with respect to the portion of the solder resist layer 27A, which is exposed through the opening portion OP4 of the resist layer R4. Namely, the exposed portion of the solder resist layer 27A through the opening portion OP4 is scraped off into a step-like shape (thickness of the portion is entirely reduced) by the sand blast. In this manner, the concave portion DP2 having a flat bottom surface is formed, and the surfaces of the respective pads P3 are collectively exposed at the flat bottom surface (surface of the solder resist layer 27).

Figure 5D:
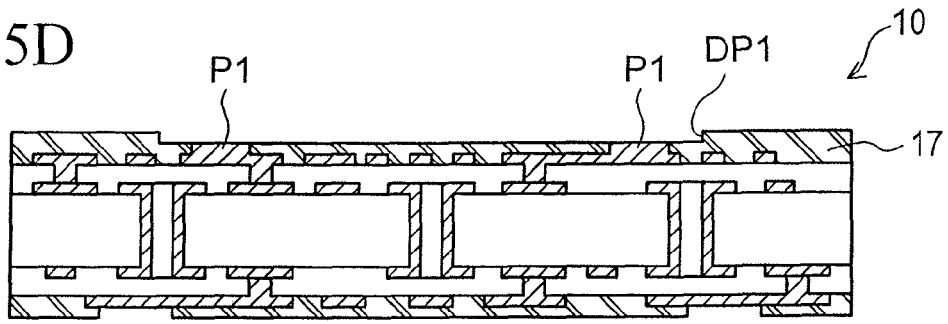

In the final step (FIG. 9D), the resist mask (the resist layer R4 in FIG. 9C) is removed in the same manner as the processing performed in the step of FIG. 5D. In addition, pre-coating solder (not shown) is attached to the pads P3 exposed at the surface of the solder resist layer 27 on the chip mounting surface side.

Through the aforementioned steps, the wiring board (semiconductor package) 20 according to the second embodiment is fabricated.

As compared with the first embodiment (FIGS. 1A to 5D), the second embodiment (FIGS. 6A to 9D) is different in the arrangement of the pads P3 for flip-chip bonding (arrangement of the pads is a matrix type in the second embodiment while the arrangement thereof is a peripheral type in the first embodiment). However, the basic configuration (the concave portion DP2 is formed across the entire chip mounting area of the solder resist layer 27 on the chip mounting surface side; the surfaces of the pads P3 exposed in the concave portion DP2 are flush with the surface of the solder resist layer 27; and only the portions of the pads P3 are formed thicker than the other wiring portion) of the wiring board and the process of the manufacturing method are the same as those of the first embodiment. Thus, the same operational effects can be achieved.

Third Embodiment

See FIGS. 10a to 14c

Figure 10A:
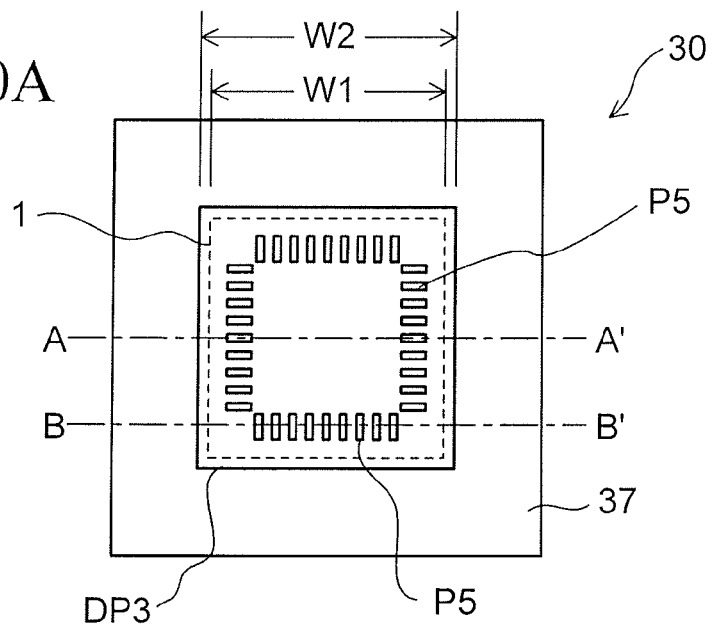
FIGS. 10A to 10C are diagrams for showing a configuration of a wiring board (semiconductor package) according to a third embodiment of the present invention.
Figure 10B:
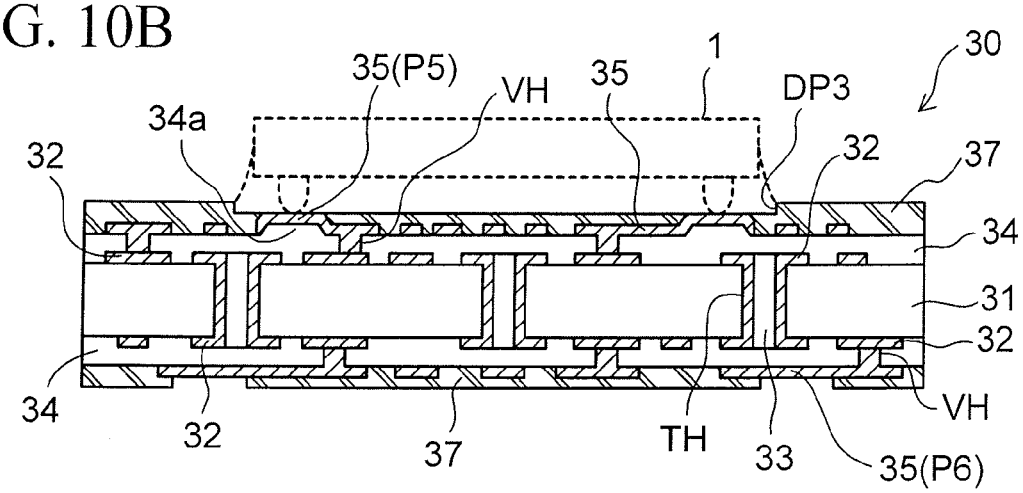
Figure 10C:
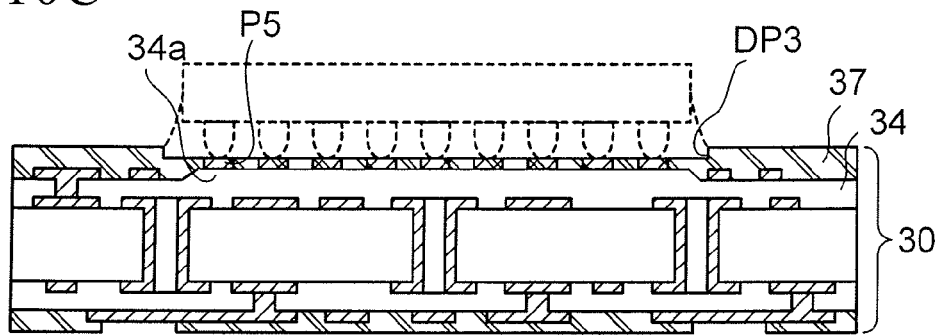

FIGS. 10A to 10C are diagrams provided for showing a configuration of a wiring board (semiconductor package) according to a third embodiment of the present invention. FIG. 10A shows the configuration when the wiring board is viewed from above, FIG. 10B shows the configuration when the wiring board is viewed in a cross section taken along the line A-A' of FIG. 10A, and FIG. 10C shows the configuration when the wiring board is viewed in a vertical cross section taken along the like B-B' of FIG. 10A, likewise.

As compared with the configuration of the wiring board 10 (FIGS. 1A to 1C), a wiring board (semiconductor package) 30 according to the third embodiment is different in that a wiring layer 35 positioned outermost on the chip mounting surface side is formed into a step-like shape (in the form of three-dimensional wiring), that pads P5 for flip-chip bonding are defined at portions on the wiring layers 35 in the step-like shape, and that portions (convex portions 34a) respectively corresponding to the positions of the pads P5 in an insulating layer (resin layer) 34 are formed thicker than the other insulating resin portion, the insulating layer 34 being the underlying layer of the wiring layer 35. Namely, unlike the first and second embodiments where only the portions of the pads P1 and P3 for flip-chip bonding are formed thicker than the other wiring portion, in the third embodiment, the portions (convex portions 34a) of the insulating layer 34 immediately below the pads P5 for flip-chip bonding are formed relatively thicker, so that only the portions of the pads P5 are formed at a position higher than the other wiring portion. The other configuration of the wiring board 30 is basically the same as that of the wiring board 10 according to the first embodiment.

Namely, the wiring board 30 according to the present embodiment also includes: a core substrate 31; wiring layers 32 formed on both surfaces of the core substrate 31, respectively, via through holes TH (Cu plated film formed on inner surfaces of the core substrate 31) formed inside the core substrate 31; resin 33 used to fill the inside of each of the through holes TH; insulating layers (resin layers) 34 formed on the both surfaces of the core substrate 31 while covering the wiring layers 32, respectively; and wiring layers 35 each formed so as to be connected with a corresponding one of the wiring layers 32, which are the underlying layers of the respective insulating layers 34, through via holes VH (conductors filled inside the insulating layers 34) formed in each of the insulating layers 34. Then, as to the insulating layer on the chip mounting surface side, the portions (convex portions 34a) thereof corresponding to the pads P5 are formed thicker than the other insulating resin portions as described above.

The wiring layer 35 on the insulating layer 34 is thus formed in a step-like shape because of the presence of the convex portions 34a, and the pads P5 are defined at the step-like shaped portions of the wiring layers 35, respectively.

Furthermore, a concave portion DP3 which defines the chip mounting area is formed in the size W2 larger than the size W1 of the chip 1 to be mounted thereon at a solder resist layer (outermost insulating layer) 37 formed on the chip mounting surface side. In addition, the pads P5 are formed, so that the pads P5 are exposed in the concave portion DP3 and that the surfaces of the pads P5 are flush with the surface of the solder resist layer 37 in the concave portion DP3. A solder resist layer (outermost insulating layer) 37 is also formed on the surface side opposite to the chip mounting surface side so as to cover the surface of a corresponding one of the outermost wiring layers 35 while exposing the portions of pads P6 defined at portions of the outermost wiring layers 35.

Figure 11:
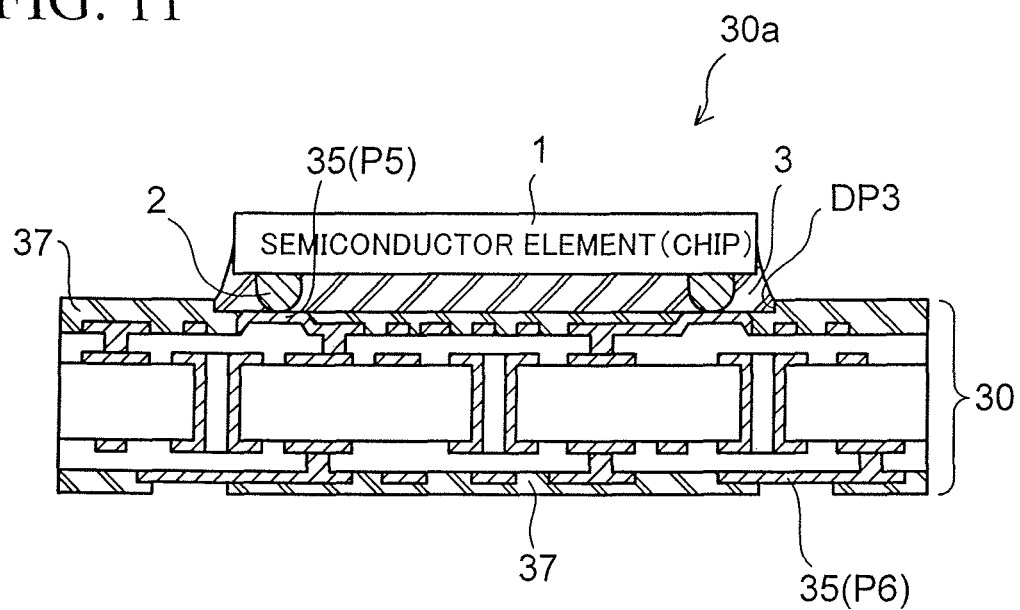
FIG. 11 is a cross-sectional view showing a state where a semiconductor element (electronic component) is mounted on the wiring board in FIGS. 10A to 10C)
Figure 12A:
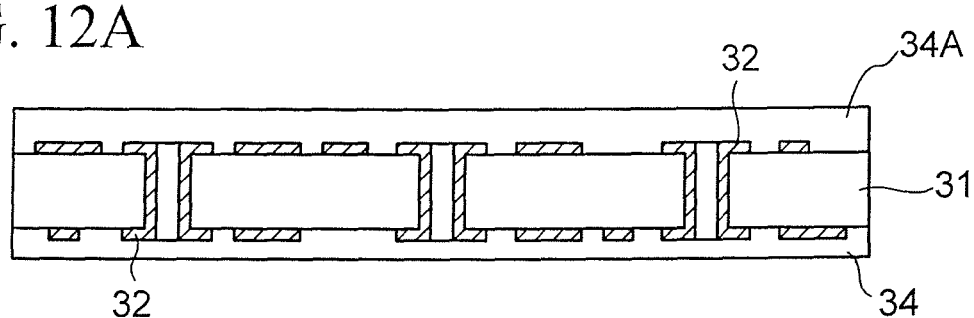
FIGS. 12A to 12C are cross-sectional views showing manufacturing steps of the wiring board in FIGS. 10A to 10C.
Figure 12B:
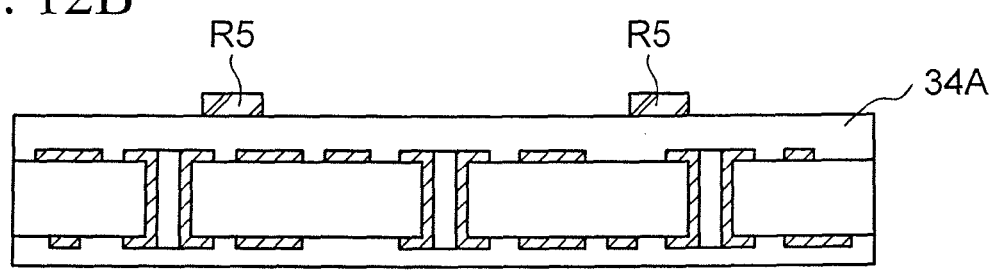
Figure 12C:
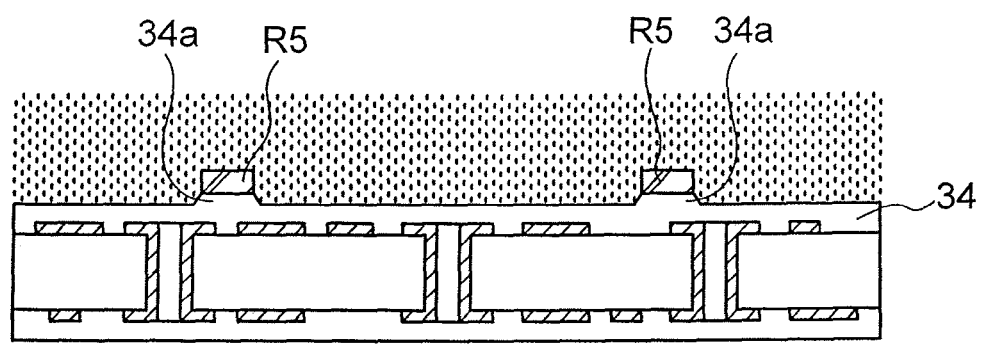
Figure 13A:
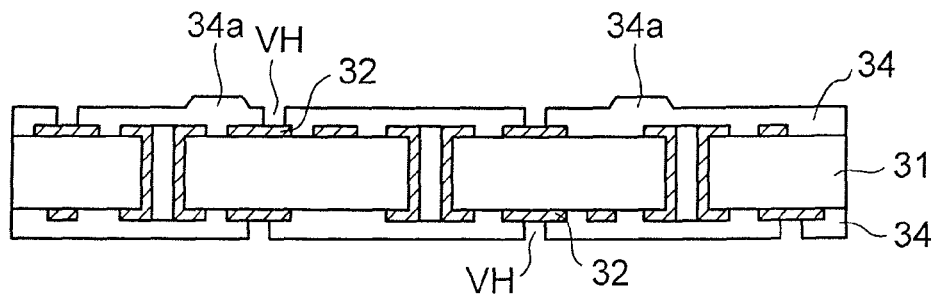
FIGS. 13A to 13D are cross-sectional views showing manufacturing steps subsequent to the manufacturing steps in FIGS. 12A to 12C.
Figure 13B:
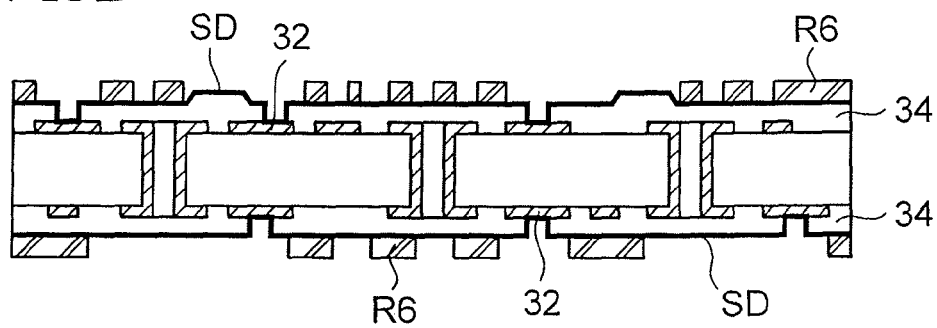
Figure 13C:
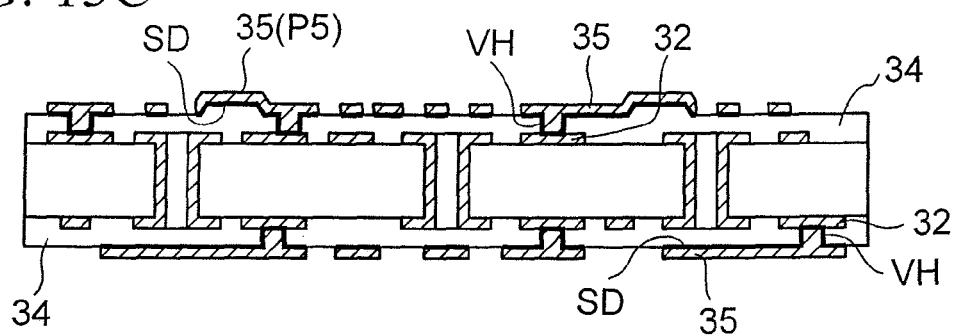
Figure 13D:
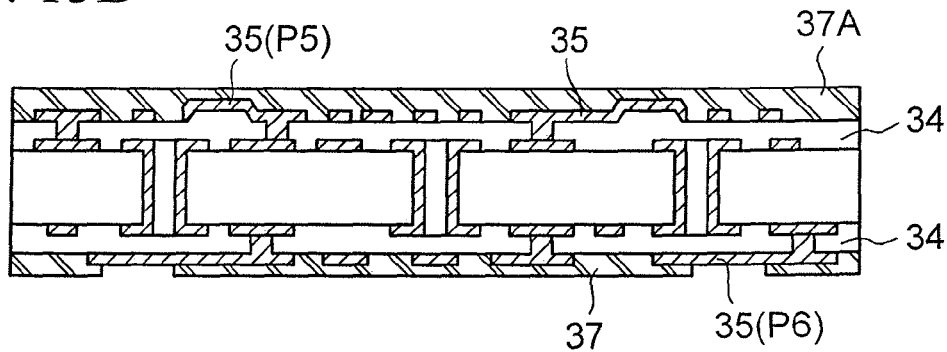
Figure 14A:
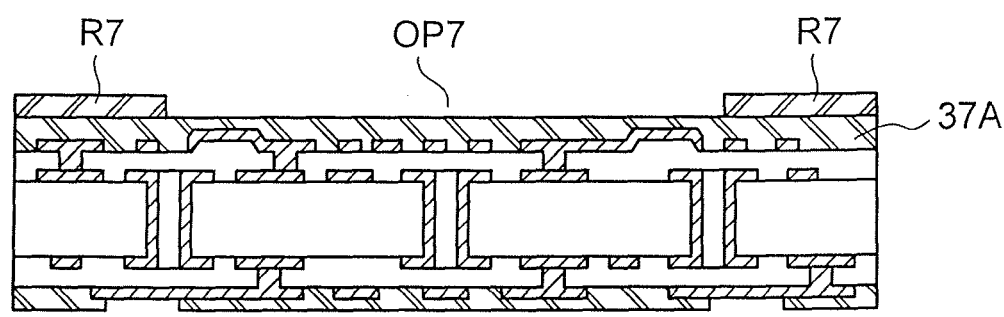
FIGS. 14A to 14C are cross-sectional views showing manufacturing steps subsequent to the manufacturing steps in FIGS. 13A to 13D.
Figure 14B:
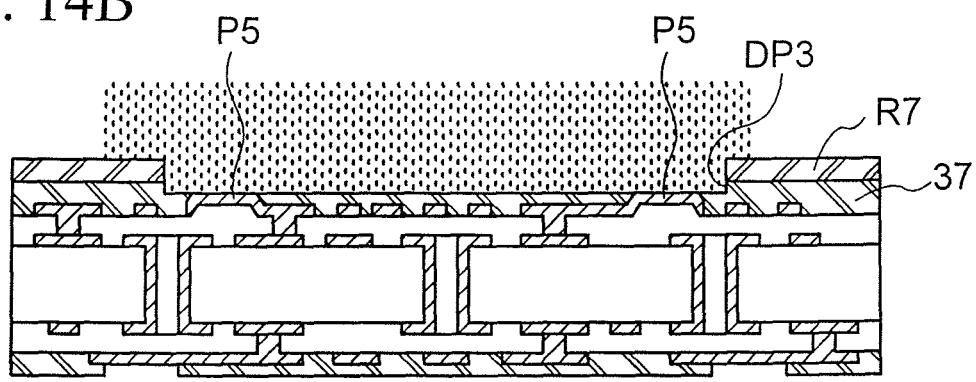
Figure 14C:
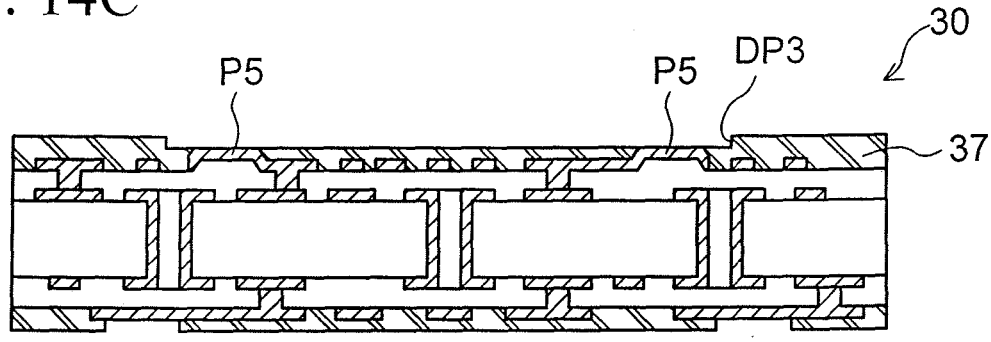

FIG. 11 shows a cross-sectional structure of a state where the semiconductor element (chip) 1 as an electronic component is mounted on the wiring board 30 of the present embodiment (case where the wiring board is configured as a semiconductor device 30a). In this embodiment as well, the semiconductor chip 1 is flip-chip bonded to the pads P5 (wiring layers 35) exposed in the concave portion DP3 via electrode terminals 2 of the semiconductor chip 1, respectively, the concave portion DP3 formed at the solder resist layer 37 on the chip mounting surface side. Furthermore, the underfill resin 3 is filled into a gap between the chip 1 mounted in the concave portion DP3 and the wiring board 30. The underfill resin 3 is then thermally cured, thereby, fixing the chip 1 to the wiring board 30. On the other hand, external connection terminals such as solder balls or pins are bonded to the pads P6 (wiring layers 35) by reflow soldering or the like, as appropriate, the pads P6 exposed from the solder resist layer 37 on the surface side opposite to the chip mounting surface side.

Next, a description is given of a method of manufacturing the wiring board (semiconductor package) 30 according to the third embodiment with reference to FIGS. 12A to 14C provided for showing an example of the manufacturing steps of the method. In order to avoid a redundant description for the same processing as the processing performed in the steps of the process (FIGS. 3A to 5D) according to the first embodiment, a description is given of only different processing in a simple manner.

Figure 3B:
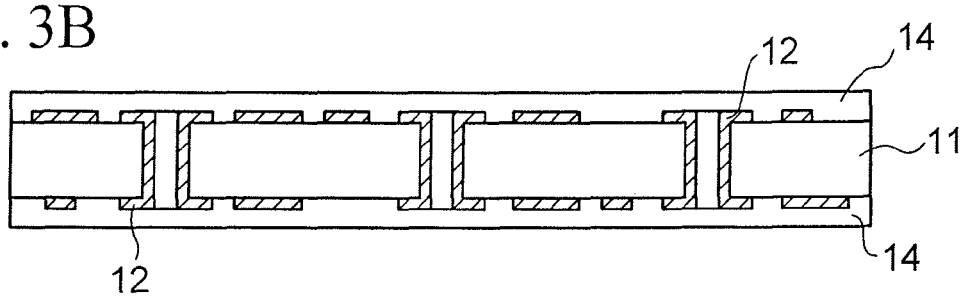

First, in the same manner as the processing performed in the step of FIG. 3B, resin layers (insulating layers) 34A and 34 are formed on the both surfaces of the core substrate 31 so as to cover the wiring layers 32, respectively, in the initial step (FIG. 12A) with respect to the structure fabricated through the same processing as the processing performed in the step of FIG. 3A. In this case, the insulating layer 34A on the chip mounting surface side is formed to have a thickness (for example, approximately 50 to 60 μm) which is larger than a thickness (for example, approximately 30 μm) of the insulating layer 34 by a predetermined amount of thickness, the insulating layer being on the surface side opposite to the chip mounting surface side. Here, the "predetermined amount of thickness" defines the height of the convex portions 34a to be formed at the insulating layer 34 described later.

In the next step (FIG. 12B), a resist mask (resist layer R5) is formed on the insulating layer 34A on the chip mounting surface side in the same manner as the processing performed in the step of FIG. 5B. The resist layer R5 is formed by patterning in accordance with the shape of the convex portions 34a to be formed so that only portions of the resist layer R5, which correspond to the positions where the concave portions 34a are formed, can remain.

In the next step (FIG. 12C), in the same manner as the processing performed in the step of FIG. 5C, sand blast is performed by using the resist layer R5 as a mask with respect to the portion of the solder resist layer 34A, which is exposed from the resist layer R5. Namely, the exposed portion of the solder resist layer 34A is scraped off into a step-like shape (thickness of the portion is entirely reduced) by the sand blast. In this manner, the portions (portions of the insulating layer 34A) covered by the resist layer R5 are left unchanged, and an insulating layer 34 including the portions each having a thickness larger than the other insulating resin portion are formed.

Figure 3C:
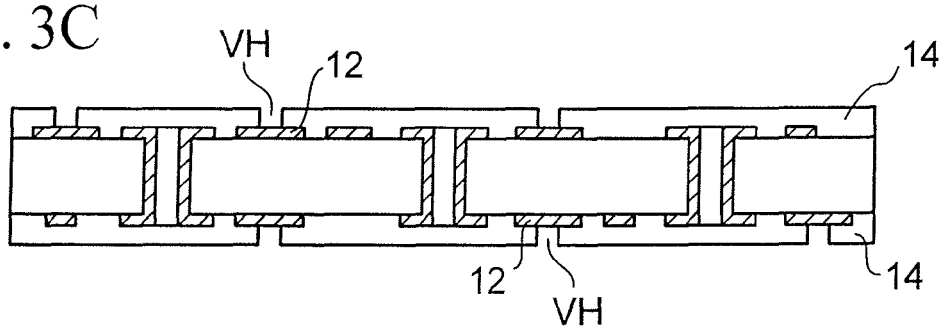

In the next step (FIG. 13A), after the resist mask (resist layer R5 of FIG. 12C) is removed in the same manner as the processing performed in the step of FIG. 5D), in the same manner as the processing performed in the step of FIG. 3C, via holes VH extending to a corresponding one of the underlying wiring layers (portions of the pads) 32 are formed at predetermined positions of each of the resin layers (insulating layers) 34 on the both surfaces by a hole making process with a $CO_2$ laser, an excimer laser or the like. In the illustrated example, three via holes VH are formed on each of the upper and lower surfaces.

Figure 3D:
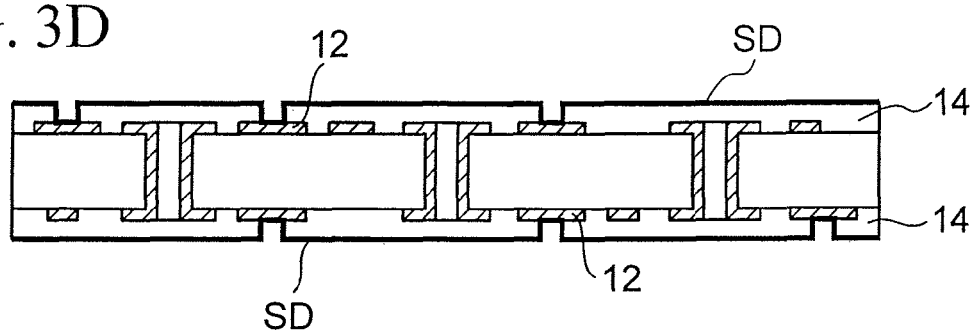

In the next step (FIG. 13B), in the same manner as the processing performed in the steps of FIGS. 3D and 4A, seed layers (plating power feeding layers) SD are formed by electroless Cu plating on the entire surfaces (on the insulating layers 34) including the portions of the wiring layer 32, which are exposed at the bottom surfaces of the via holes VH, respectively, after the desmear processing is performed to remove the resin residue (smear) attached to the bottom surfaces (on the wiring layers 32) of the via holes VH. Furthermore, resist masks for plating are formed on the both surfaces of the seed layers SD, respectively, by using a patterning material. Then, resist layers R6 each having opening portions and formed by patterning in accordance with the shape of a corresponding one of the wiring layers 35 to be formed are formed.

In the next step (FIG. 13C), in the same manner as the processing performed in the step of FIG. 4A, the wiring layers (wiring patterns) 35 are formed, by using electrolytic plating using the seed layers SD as power feeding layers, on the seed layers (Cu) SD exposed through the respective resist layers R6 on the both surfaces. The wiring layers 35 are the second layers each connected to a corresponding one of the wiring layers (portions of the pads) 32, which are the underlying layers thereof, by filling the inside of the via holes VH (formation of vias). Furthermore, in the same manner as the processing performed in the step of FIG. 4D, the resist masks (resist layers R6 of FIG. 13B) on the both surfaces are removed, and the exposed portions of the seed layers (Cu) SD are subjected to etching.

Through the aforementioned processing, the following structure is obtained. Specifically, in the structure, the wiring layers 35, which are the second layers, are formed on the both surfaces, respectively, as illustrated. In addition, as the wiring layer 35 on the chip mounting surface side, each of the wiring portions corresponding to the concave portions 34a (See FIG. 13A) of the insulating layer 34 is formed in a step-like shape. Furthermore, the pads P5 are defined at the step-like shaped portions of the wiring layers 35, respectively. Also, in order to simplify the drawings, illustration of the seed layers SD is omitted in the next step or later.

In the next step (FIG. 13D), in the same manner as the processing performed in the step of FIG. 5A, solder resist layers 37A and 37 are formed so as to cover the wiring layers 35 formed on the both surfaces, respectively. Namely, the solder resist layer 37A on the chip mounting surface side is formed to cover the enter surface of the wiring layer 35, and the solder resist layer 37 on the external connection terminal bonding surface side is formed so as to cover the surface of the wiring layer 35 while exposing the portions of pads P6 each defined at required positions of the wiring layers 35 as illustrated. The thickness of the portions of the solder resist layer 37A formed on the pads P5 on the chip mounting surface side defines the depth of the dam (concave portion DP3) to be formed, so that the thickness thereof is selected in consideration of the size of the chip to be mounted, and the amount of resin overflowing from the gap between the chip and the wiring board to the periphery thereof when the underfill resin is filled into the gap at the time of mounting of the chip. Also, the pads P6 on the opposite surface side are provided with Ni plating and Au plating in this order, as appropriate.

In the next step (FIG. 14A), a resist mask is formed on the solder resist layer 37A on the chip mounting surface side, and a required position thereof is opened (formation of a resist layer R7 provided with an opening portion OP7) in the same manner as the processing performed in the step of FIG. 5B. The opening portion OP7 is formed by patterning in accordance with the shape of the concave portion DP3 to be formed.

In the next step (FIG. 14B), in the same manner as the processing performed in the step of FIG. 5C, sand blast is performed by using the resist layer R7 as a mask with respect to the portion of the solder resist layer 37A, which is exposed through the opening portion OP7 of the resist layer R7. Namely, the exposed portion of the solder resist layer 37A is scraped off into a step-like shape (thickness of the portion is entirely reduced) by the sand blast. In this manner, the concave portion DP3 having a flat bottom surface is formed, and the surfaces of the respective pads P5 are collectively exposed at the flat bottom surface (surface of the solder resist layer 37).

In the final step (FIG. 14C), the resist mask (resist layer R7 of FIG. 14B) is removed in the same manner as the processing performed in the step of FIG. 5D. In addition, pre-coating solder (not shown) is attached to the pads P5 exposed at the surface of the solder resist layer 37 on the chip mounting surface side.

Through the aforementioned steps, the wiring board (semiconductor package) 30 according to the third embodiment is fabricated.

As compared with the first embodiment (FIGS. 1A to 5D), the third embodiment (FIGS. 10A to 14C) is different in the form of the pads P5 for flip-chip bonding (the portions of the insulating layer 34 immediately below the pads P5 are formed thicker, so that only the portions of the pads P5 are formed at a higher position than the other wiring portion in the third embodiment while only the portions of the pads P1 are formed thicker than the other wiring portion in the first embodiment). However, the basic configuration (concave portion DP3 is formed across the entire chip mounting area of the solder resist layer 37 on the chip mounting surface side, and the surfaces of the pads P5 exposed in the concave portion DP3 are flush with the surface of the solder resist layer 37) of the wiring board and the process of the manufacturing method is the same as those of the first embodiment. Thus, the same operational effects can be achieved.

Fourth Embodiment

See FIGS. 15a to 18c

Figure 15A:
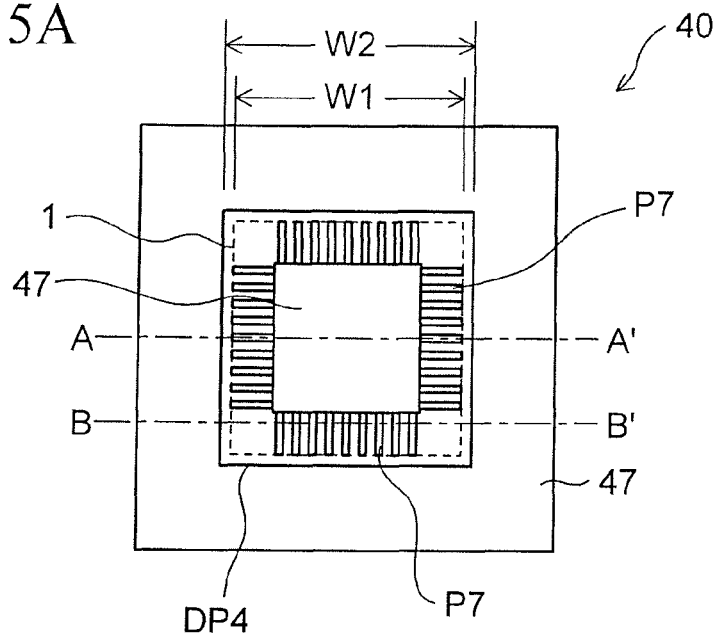
FIGS. 15A to 15C are diagrams for showing a configuration of a wiring board (semiconductor package) according to a fourth embodiment of the present invention.
Figure 15B:
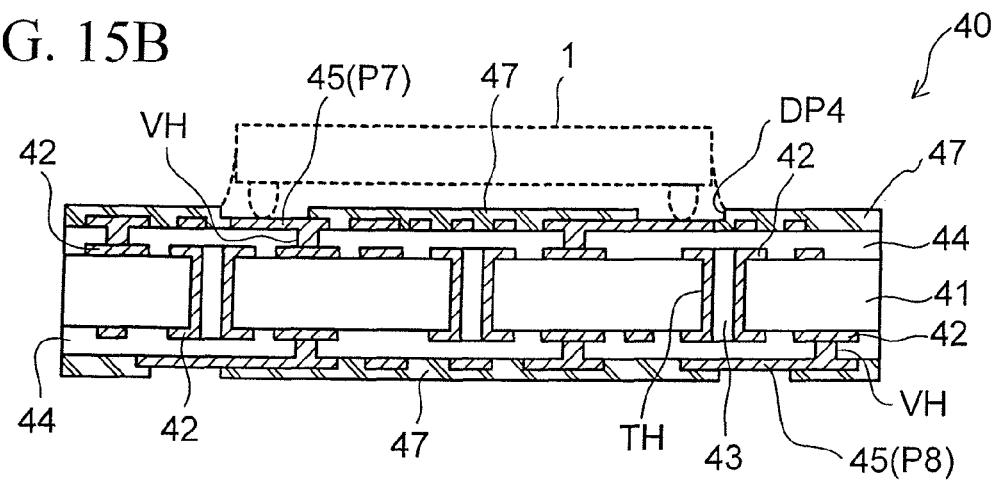
Figure 15C:
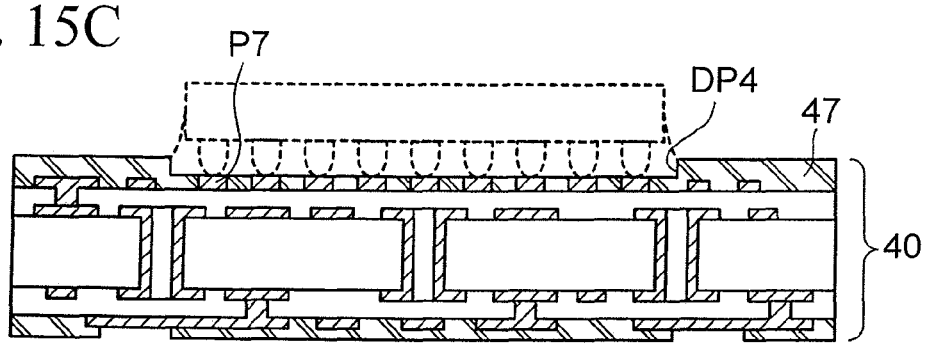

FIGS. 15A to 15C are diagrams provided for showing a configuration of a wiring board (semiconductor package)

according to a fourth embodiment of the present invention. FIG. 15A shows the configuration when the wiring board is viewed from above, FIG. 15B shows the configuration when the wiring board is viewed in a cross section taken along the like A-A' of FIG. 15A, and FIG. 15C shows the configuration when the wiring board is viewed in a cross section taken along the like B-B' of FIG. 15A, likewise.

As compared with the configuration of the wiring board 10 according to the first embodiment (FIGS. 1A to 1C), a wiring board (semiconductor package) 40 according to the fourth embodiment is different in that a concave portion DP4 formed at a predetermined position (chip mounting area) of a solder resist layer on the chip mounting surface side is provided annularly at an inner side of the chip mounting area (W2) along the circumference of the chip mounting area (W2) as shown in FIG. 1A, instead of being formed across the entire chip mounting area. In addition, pads P7 for flip-chip bonding are exposed in the annular concave portion DP4. The other configuration of the wiring board 40 according to the fourth embodiment is basically the same as that of the wiring board 10 according to the first embodiment.

Namely, the wiring board 40 according to the present embodiment also includes: a core substrate 41; wiring layers 42 formed on both surfaces of the core substrate 41, respectively, via through holes TH (Cu plated film formed on inner surfaces of the core substrate 31) formed inside the core substrate 41; resin 43 used to fill the inside of each of the through holes TH; insulating layers (resin layers) 44 formed on the both surfaces of the core substrate 41 while covering the wiring layers 42, respectively; and wiring layers 45 each formed so as to be connected with a corresponding one of the wiring layers 42, which are the underlying layers of the insulating layers 44, through via holes VH (conductors filled inside the insulating layers 44) formed in each of the insulating layers 44.

Furthermore, the solder resist layer (outermost insulating layer) 47 formed on the chip mounting surface side includes a concave portion DP4. The concave portion DP4 defines the chip mounting area with the size W2 larger than the size W1 of the chip 1 to be mounted thereon. The concave portion DP4 is formed annularly at the inner side of the chip mounting area along the circumference of the chip mounting area. In addition, the concave portion DP4 is formed, so that pads P7 are exposed in the concave portion DP4 and the surfaces of the pads P7 are flush with the surface of the solder resist layer 47 in the concave portion DP4. A solder layer (outermost insulating layer) 47 is also formed on the surface side opposite to the chip mounting surface side so as to cover the surface of the outermost wiring layer 45 while exposing the portions of pads P8 defined at portions of the outermost wiring layers 45.

Figure 16:
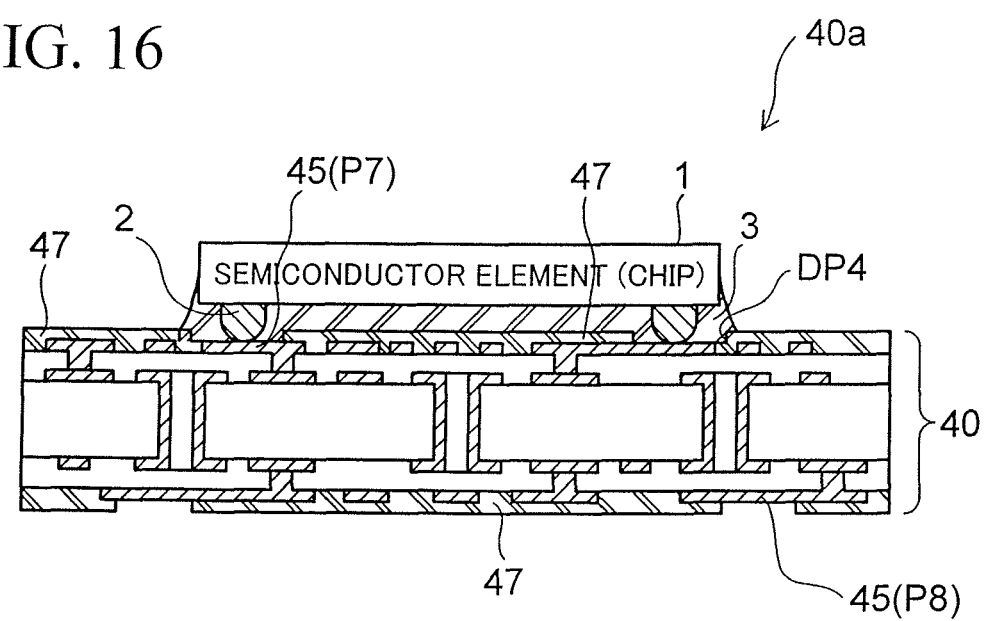
FIG. 16 is a cross-sectional view showing a state where a semiconductor element (electronic component) is mounted on the wiring board in FIGS. 15A to 15C)

FIG. 16 shows a cross-sectional structure of a state where the semiconductor element (chip) 1 as an electronic component is mounted on the wiring board 40 of the present embodiment (case where the wiring board is configured as a semiconductor device 40a). In this embodiment as well, the semiconductor chip 1 is flip-chip bonded to the pads P7 (wiring layers 45) exposed in the concave portion DP4 via electrode terminals 2 of the semiconductor element 1, respectively, the concave portion DP4 formed annularly at the solder resist layer 47 on the chip mounting surface side. Furthermore, the underfill resin 3 is filled into a gap between the chip mounted in the concave portion DP4 and the wiring board 40. The underfill resin 3 is then thermally cured, thereby, fixing the chip 1 to the wiring board 40. On the other hand, external connection terminals such as solder balls or pins are bonded to pads P8 (wiring layers 45) by reflow soldering or the like, as appropriate, the pads P8 exposed from the solder resist layer 47 on the surface side opposite to the chip mounting surface side.

Next, a description is given of a method of manufacturing the wiring board (semiconductor package) 40 according to the fourth embodiment with reference to FIGS. 17A to 18C provided for showing an example of the manufacturing steps of the method. In order to avoid a redundant description for the same processing as the processing performed in the steps of the process (FIGS. 3A to 5D) according to the first embodiment, a description is given of only different processing in a simple manner.

Figure 17A:
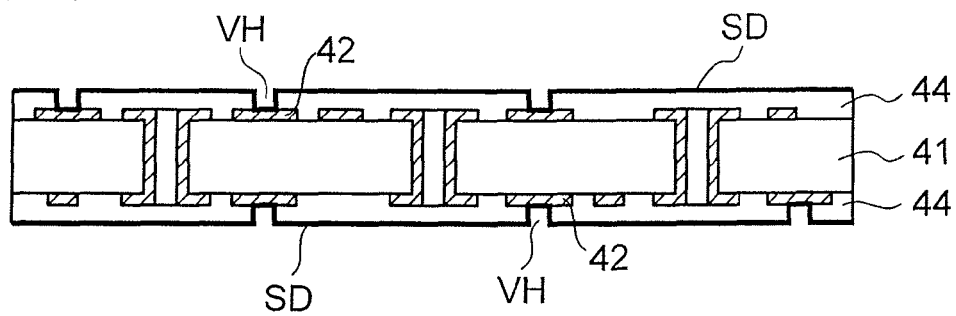
FIGS. 17A to 17C are cross-sectional views showing manufacturing steps of the wiring board in FIGS. 15A to 15C.
Figure 17B:
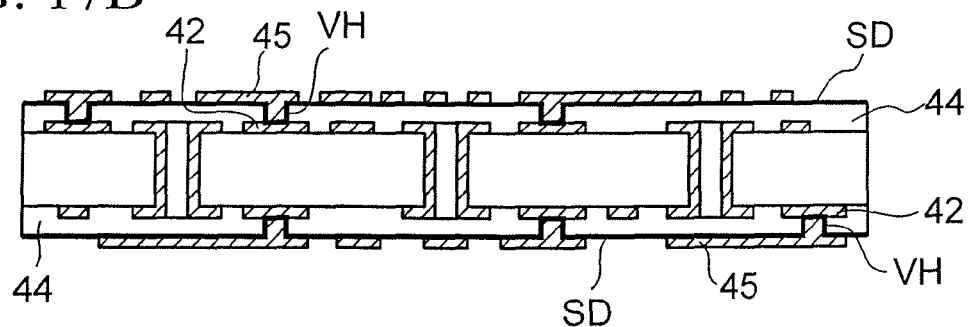
Figure 17C:
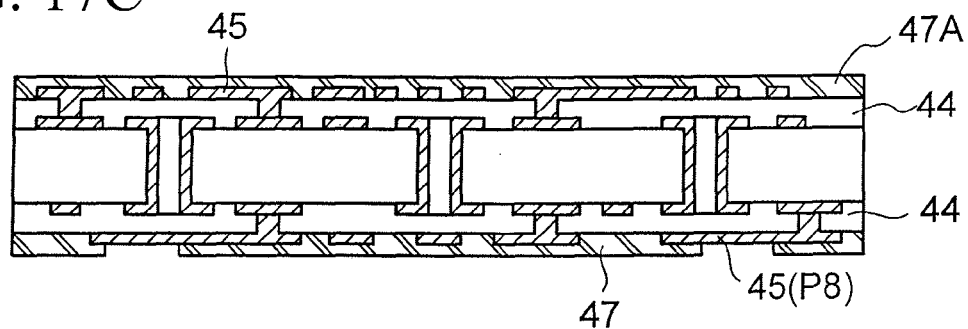
Figure 18A:
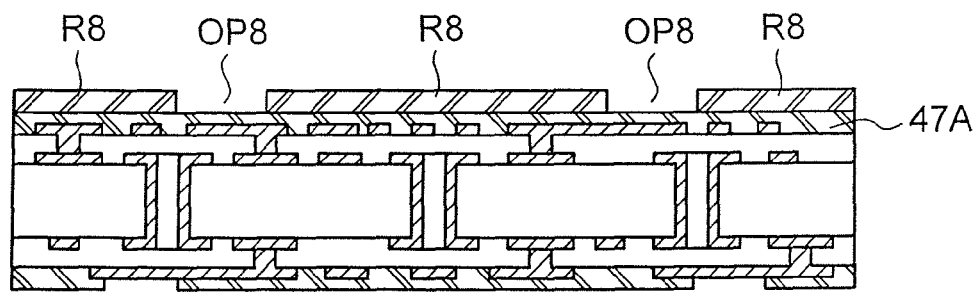
FIGS. 18A to 18C are cross-sectional views showing manufacturing steps subsequent to the manufacturing steps in FIGS. 17A to 17C.
Figure 18B:
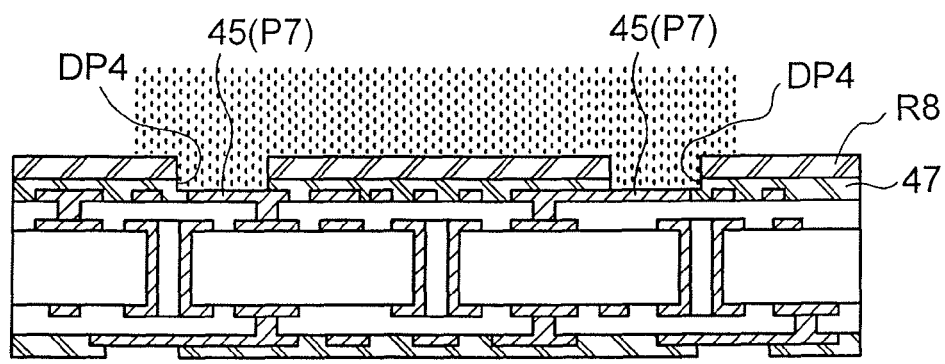
Figure 18C:
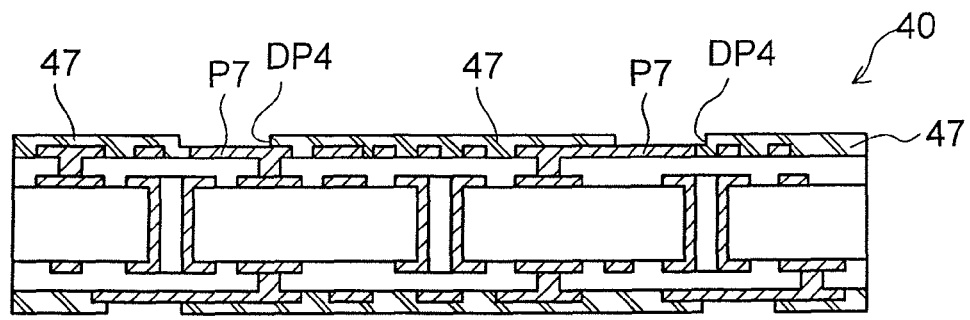

First in the same manner as the processing performed in the steps of FIGS. 3A and 3C, seed layers (plating power feeding layers) SD are formed by electroless Cu plating on the entire surfaces (on the insulating layers 44) including the portions of the wiring layer 42, which are exposed at the bottom surfaces of the via holes VH, respectively, after the desmear processing is performed to remove the resin residue (smear) attached to the bottom surfaces (on the wiring layers 42) of the via holes VH, in the initial step (FIG. 17A).

In the next step (FIG. 17B), in the same manner as the processing performed in the step of FIG. 4A, the wiring layers (wiring patterns) 45 are formed on the seed layers SD on the both surfaces, respectively. The wiring layers 45 are the second layers each connected to a corresponding one of the wiring layers (portions of the pads) 42 by filling the inside of the via holes VH (formation of vias), the wiring layers 42 being the underlying layers of the respective wiring layers 45. A semi-additive method is used in the formation of the wiring layers 45, for example.

In the next step (FIG. 17C), in the same manner as the processing performed in the steps of FIG. 5A, solder resist layers 47A and 47 are formed so as to cover the wiring layers 45 formed on the both surfaces, respectively. Namely, the solder resist layer 47A on the chip mounting surface side is formed so as to cover the enter surface of the wiring layer 45, and the solder resist layer 47 on the external connection terminal bonding surface side is formed so as to cover the surface of the wiring layer 45 while exposing the portions of pads P8 defined at required positions of the wiring layers 45 as illustrated. The thickness of the portions of the solder resist layer 47A to be formed on the wiring layer 45 on the chip mounting surface side defines the depth of the dam (concave portion DP4) to be formed, so that the thickness thereof is selected in consideration of the size of the chip to be mounted, and the amount of resin overflowing from the gap between the chip and the wiring board to the periphery thereof when the underfill resin is filled into the gap at the time of mounting the chip. Likewise, the pads P8 on the opposite surface side is provided with Ni plating and Au plating in this order, as appropriate.

In the next step (FIG. 18A), in the same manner as the processing performed in the steps of FIG. 5B, a resist mask is formed on the solder resist layer 47A on the chip mounting surface side and a required portion thereof is opened (formation of a resist layer R8 provided with an opening portion OP8). The opening portion OP8 is formed by patterning in accordance with the shape of the concave portion DP4 to be formed annularly.

In the next step (FIG. 18B), in the same manner as the processing performed in the steps of FIG. 5C, sand blast is performed by using the resist layer R8 as a mask with respect to the portion of the solder resist layer 47A, which is exposed through the opening portion OP8 of the resist layer R8. Namely, the exposed portion of the solder resist layer 47A is scraped off into a step-like shape (thickness of the portion is entirely reduced) by the sand blast. In this manner, the concave portion DP4 having a flat bottom surface is formed, and the surfaces of the respective pads P7 are collectively exposed at the flat bottom surface (surface of the solder resist layer 47).

In the final step (FIG. 18C), the resist mask (the resist layer R8 in FIG. 18B) is removed in the same manner as the processing performed in the step of FIG. 5D. In addition, precoating solder (not shown) is attached to the pads P7 exposed at the surface of the solder resist layer 47 on the chip mounting surface side.

Through the aforementioned steps, the wiring board (semiconductor package) 40 according to the fourth embodiment is fabricated.

As compared with the first embodiment (FIGS. 1A to 5D), the fourth embodiment (FIGS. 15A to 18C) is different in the form of the concave portion DP4 in which the pads P7 for flip-chip bonding are exposed (concave portion DP4 is formed annularly at the inner side of the chip mounting area along the circumference of the chip mounting area while the concave portion is formed across the entire chip mounting area in the first embodiment). However, the basic configuration (concave portion DP4 is formed at the solder resist layer 47 on the chip mounting surface side, and the surfaces of the pads P7 exposed in the concave portion DP4 are flush with the surface of the solder resist layer 47) of the wiring board and the process of the manufacturing method are the same as those of the first embodiment. Thus, the same operational effects can be achieved.

In each of the aforementioned first to fourth embodiments, the description is given of a wiring board having a core substrate (support base member) fabricated by using a general build-up method, as an example of the form of the wiring board 10 (20, 30 or 40). However, as it is obvious from the gist of the present invention, the form of the wiring board is not limited to this. In short, a wiring board having the following configuration is sufficient as the wiring board to which the present invention can be applied. First, the concave portion DP1 (DP2, DP3 or DP4) in a size (outer shape) larger than a size (outer shape) of the chip to be mounted thereon is formed at a predetermined position of the outermost insulating layer (solder resist layer) on the chip mounting surface side. In addition, pads for flip-chip bonding are exposed in the concave portion, and the surfaces of the pads are formed so as to be flush with the surface of the solder resist layer (board surface onto which underfill resin, filled into the gap after the mounting of the chip, flows).

The present invention can be applied in the same manner to a wiring board referred to as "coreless board," which includes no support base member. The "coreless board" has a structure in which multiple wiring layers are stacked one on top of another with an insulating layer (resin layer) interposed therebetween, and the wiring layers are interconnected to one another through via holes (conductors filled into the via holes: vias) formed in each of the resin layers. As to the manufacturing method of the coreless board, a technique previously proposed by the applicant of the present invention (JPP (Kokai) 2007-158174, for example) can be used.

What is claimed is:

1. A wiring board, comprising:
an outermost wiring layer which is formed on an insulating layer made of resin in the wiring board, extends outside of a mounting area for an electronic component, and includes a convex portion being formed thicker than the other portion of the outermost wiring layer in the mounting area for an electronic component and serving as a pad;
a solder resist layer formed on a chip mounting surface and an external connection terminal bonding surface opposite to the chip mounting surface, which covers the outermost wiring layer and the insulating layer, is formed of a single layer and is different resin from the resin of the insulating layer;
an electronic component mounted on the solder resist layer of the chip mounting surface; and
an underfill resin filling the gap between the electronic component and the solder resist layer,
wherein the solder resist layer of the chip mounting surface is thicker than that of the external connection terminal bonding surface, the solder resist layer of the chip mounting surface includes a concave portion which corresponds to the mounting area for mounting thereon the electronic component and to an area accommodating an underfill resin, the concave portion being formed in a larger size than a size of the electronic component and in a step-like shape, and has a flat bottom surface formed of the solder resist layer,
wherein a top surface of the pad is exposed at the flat bottom surface of the concave portion to be flush with the flat bottom surface of the concave portion, and a side surface of the pad and the outermost wiring layer other than the top surface of the pad are covered with the solder resist layer,
wherein the pad of the outermost wiring layer is formed of a portion of the wiring layer and a conductive layer which is made of the same metal as the wiring layer and the conductive layer is laminated on and integrated with the portion of the wiring layer,
wherein the electronic component is placed inside the concave portion in a plain-view, and flip-chip bonded to the pad in the concave portion,
wherein a height of the gap between the electronic component and the bottom surface of the concave portion is larger than a height of the step-shape portion which surrounding the concave portion, and
wherein the underfill resin fill a gap between the electronic component and the bottom surface of the concave portion, and cover the area between outside of the electronic component and the step-shape portion surrounding the concave portion, and a part of the underfill resin is creeping up the side surface of the electronic component to form a fillet portion.

2. A wiring board, comprising:
an insulating layer, which is made of resin, is formed on a surface side of the wiring board and includes a convex portion formed thicker than the other portion of the insulating layer in a mounting area for the electronic component;
an outermost wiring layer which is formed on the insulating layer and extends outside of the mounting area for the electronic component, and of which a wiring portion on the convex portion of the insulating layer has a step-like shape and serves as a pad;
a solder resist layer formed on a chip mounting surface and an external connection terminal bonding surface opposite to the chip mounting surface, which covers the outermost wiring layer and the insulating layer, is formed of a single layer, and is different resin from the resin of the insulating layer in the wiring board underlying the solder resist layer, and protects the wiring board;
an electronic component mounted on the solder resist layer of the chip mounting surface; and
an underfill resin filling the gap between the electronic component and the solder resist layer, wherein the solder resist layer of the chip mounting surface is thicker than that of the external connection terminal bonding surface, the solder resist layer of the chip mounting surface includes a concave portion which corresponds to the mounting area for mounting thereon the electronic component and to an area accommodating an underfill resin, the concave portion being formed in a larger size than a size of the electronic component and in a step-like shape, and has a flat bottom surface formed of the solder resist layer, wherein a top surface of the pad is exposed at the flat bottom surface of the concave portion to be flush with the flat bottom surface of the concave portion, and a side surface of the pad and the outermost wiring layer other than the top surface of the pad are covered with the solder resist layer, wherein the pad of the outermost wiring layer is made of the same metal as the wiring layer and is integrated with the wiring portion on the convex portion of the insulating layer, wherein the electronic component is placed inside the concave portion in a plain-view, and flip-chip bonded to the pads in the concave portion, wherein a height of the gap between the electronic component and the bottom surface of the concave portion is larger than a height of the step-shape portion which surrounding the concave portion, and wherein the underfill resin fill a gap between the electronic component and the bottom surface of the concave portion, and cover the area between outside of the electronic component and the step-shape portion surrounding the concave portion, and a part of the underfill resin is creeping up the side surface of the electronic component to form a fillet portion.

3. The wiring board for use in mounting of an electronic component as defined in claim 1, wherein, when the electronic component is mounted on the pad, an underfill resin is filled in a gap between the electronic component and the solder resist layer.

4. The wiring board for use in mounting of an electronic component as defined in claim 2, wherein, when the electronic component is mounted on the pad, an underfill resin is filled in a gap between the electronic component and the solder resist layer.

* * * * *